(12) United States Patent
Kiyosawa et al.

(10) Patent No.: US 8,847,238 B2
(45) Date of Patent: Sep. 30, 2014

(54) SEMICONDUCTOR DEVICE WHICH CAN WITHSTAND HIGH VOLTAGE OR HIGH CURRENT AND METHOD FOR FABRICATING THE SAME

(71) Applicant: Panasonic Corporation, Osaka (JP)

(72) Inventors: Tsutomu Kiyosawa, Hyogo (JP); Masao Uchida, Osaka (JP); Nobuyuki Horikawa, Kyoto (JP); Koutarou Tanaka, Osaka (JP); Kazuhiro Kagawa, Hyogo (JP); Yasuyuki Yanase, Gifu (JP); Takashi Hasegawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/125,860

(22) PCT Filed: May 20, 2013

(86) PCT No.: PCT/JP2013/003203
§ 371 (c)(1),
(2), (4) Date: Dec. 12, 2013

(87) PCT Pub. No.: WO2014/073127
PCT Pub. Date: May 15, 2014

(65) Prior Publication Data
US 2014/0183562 A1 Jul. 3, 2014

(30) Foreign Application Priority Data
Nov. 9, 2012 (JP) .................................. 2012-247065

(51) Int. Cl.
*H01L 29/15* (2006.01)
*H01L 21/336* (2006.01)
*H01L 29/78* (2006.01)
*H01L 29/66* (2006.01)

(52) U.S. Cl.
CPC ...... *H01L 29/7802* (2013.01); *H01L 29/66712* (2013.01)
USPC .............................. 257/77; 438/105; 438/268

(58) Field of Classification Search
CPC ............ H01L 29/7802; H01L 29/1608; H01L 29/41741
USPC ..................... 257/77; 438/105, 268
See application file for complete search history.

(56) References Cited

U.S. PATENT DOCUMENTS

| 5,976,936 A | 11/1999 | Miyajima et al. |
| 6,020,600 A | 2/2000 | Miyajima et al. |

(Continued)

FOREIGN PATENT DOCUMENTS

| CN | 1484862 A | 3/2004 |
| CN | 102187463 A | 9/2011 |

(Continued)

OTHER PUBLICATIONS

International Search Report issued in International Application No. PCT/JP2013/003203 mailed Aug. 20, 2013, 3 pgs.

*Primary Examiner* — William D Coleman
(74) *Attorney, Agent, or Firm* — McDermott Will & Emery LLP

(57) ABSTRACT

A semiconductor layer 102 having a drift region 132, a body region 103, and a source region 104 provided at a position next to the body region 103; an epitaxial layer 106 in contact with the body region; and a gate insulating film 107 provided on the epitaxial layer are formed on a principal surface of a semiconductor substrate 101. The epitaxial layer includes an interface epitaxial layer 106i in contact with the body region, a first epitaxial layer 106a on the interface epitaxial layer 106i, and a second epitaxial layer 106b on the first epitaxial layer 106a. An impurity concentration of the interface epitaxial layer is higher than an impurity concentration of the first epitaxial layer, and lower than an impurity concentration of the second epitaxial layer.

15 Claims, 17 Drawing Sheets

(56) References Cited

U.S. PATENT DOCUMENTS

| | | |
|---|---|---|
| 6,054,752 A | 4/2000 | Hara et al. |
| 6,573,534 B1 | 6/2003 | Kumar et al. |
| 7,399,676 B2 * | 7/2008 | Kumar et al. ............ 438/268 |
| 7,473,929 B2 * | 1/2009 | Kusumoto et al. ......... 257/77 |
| 7,989,882 B2 * | 8/2011 | Zhang et al. ............. 257/330 |
| 2004/0021174 A1 | 2/2004 | Kobayashi |
| 2004/0051104 A1 | 3/2004 | Yamashita et al. |
| 2011/0198616 A1 | 8/2011 | Yamashita |
| 2012/0057386 A1 | 3/2012 | Adachi et al. |

FOREIGN PATENT DOCUMENTS

| | | |
|---|---|---|
| EP | 1427021 A1 | 6/2004 |
| JP | 10-308510 A | 11/1998 |
| JP | 11-307768 A | 11/1999 |
| JP | 11-354791 A | 12/1999 |
| JP | 2002-270839 A | 9/2002 |
| JP | 2003-309262 A | 10/2003 |
| JP | 2003-318396 A | 11/2003 |
| JP | 2008-017237 A | 1/2008 |
| JP | 4381807 B2 | 12/2009 |
| JP | 2011-040431 A | 2/2011 |
| JP | 2012-104856 A | 5/2012 |
| JP | 2012-114104 A | 6/2012 |
| WO | 03/028110 A1 | 4/2003 |
| WO | 2010/044226 A1 | 4/2010 |
| WO | 2010/098076 A1 | 9/2010 |
| WO | 2011/099861 A1 | 8/2011 |

\* cited by examiner

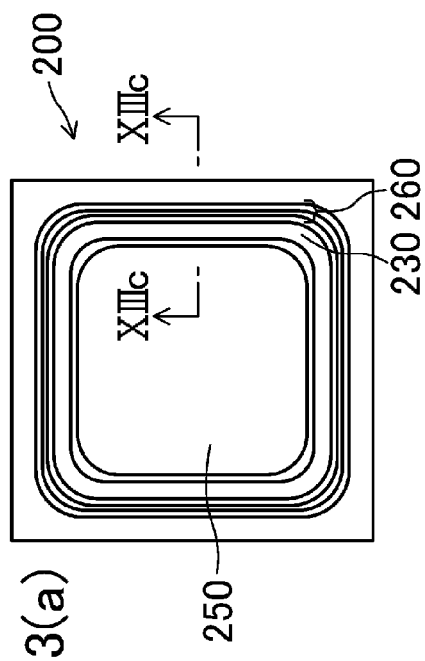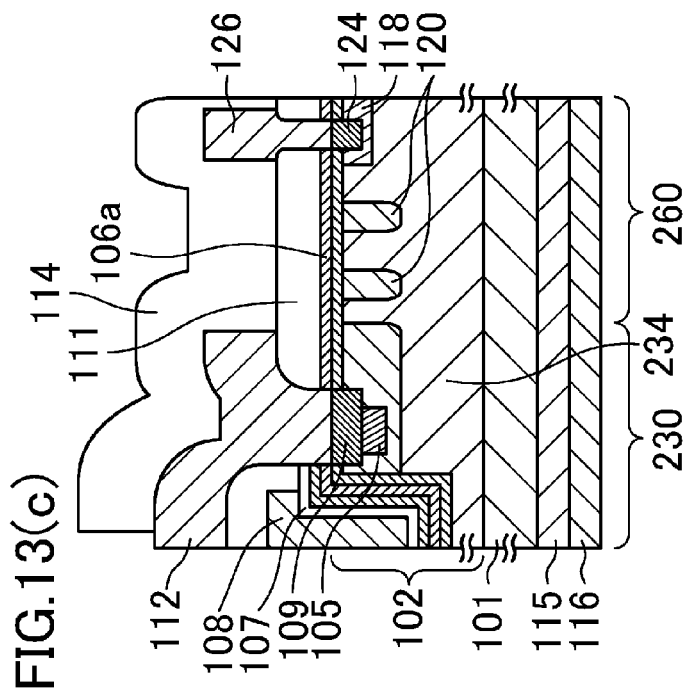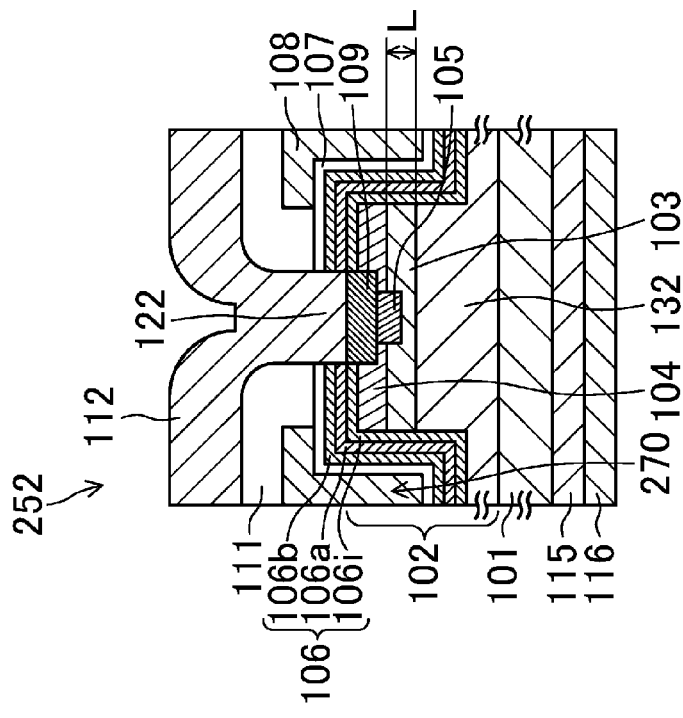
FIG.13(a)
FIG.13(b)
FIG.13(c)

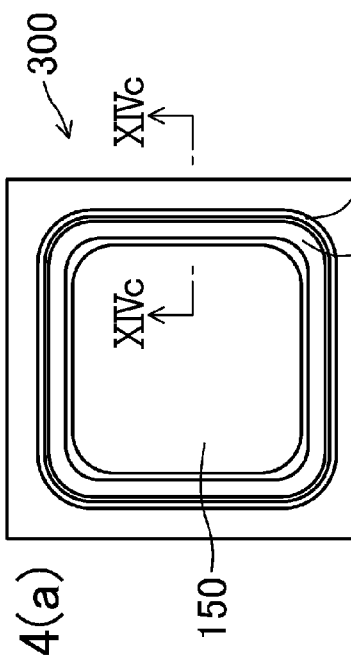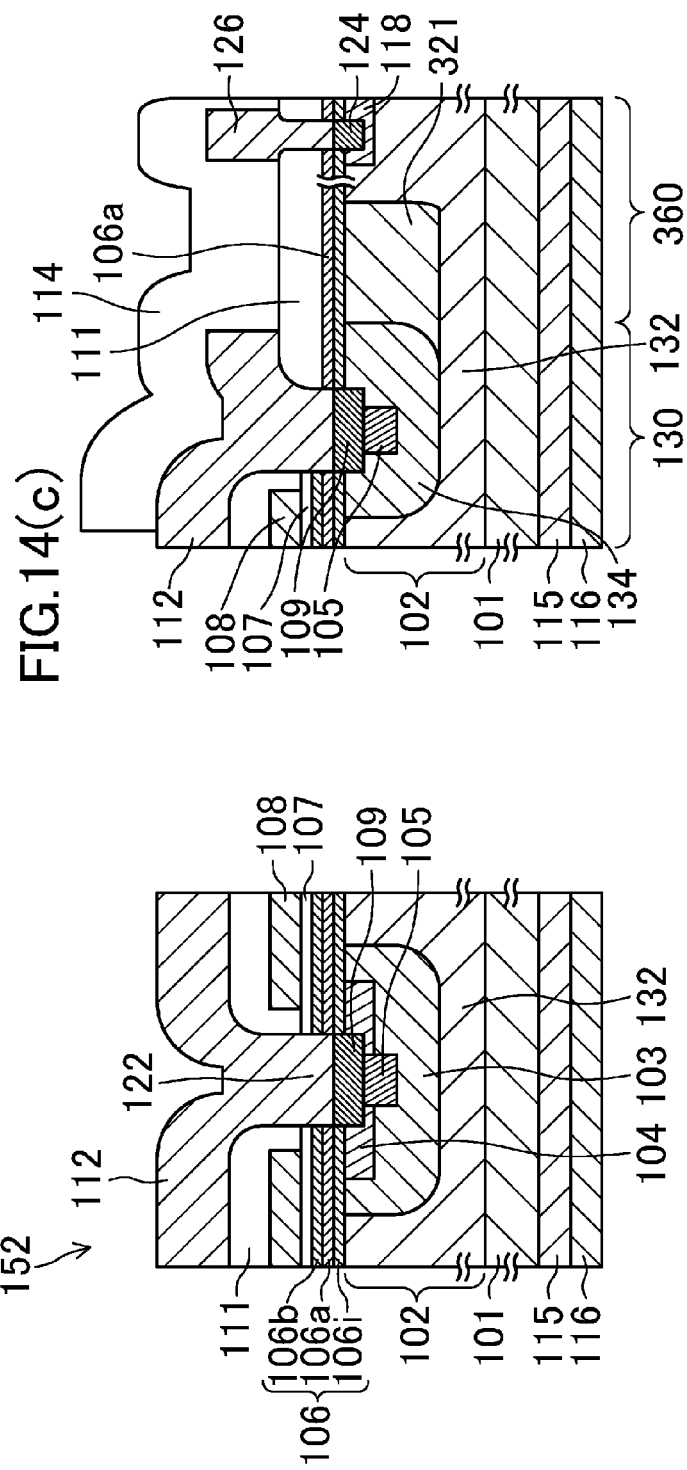

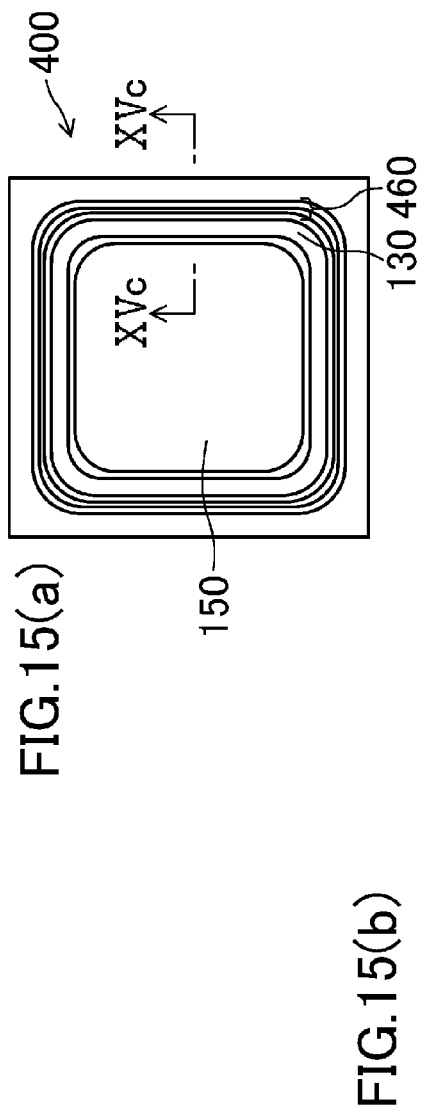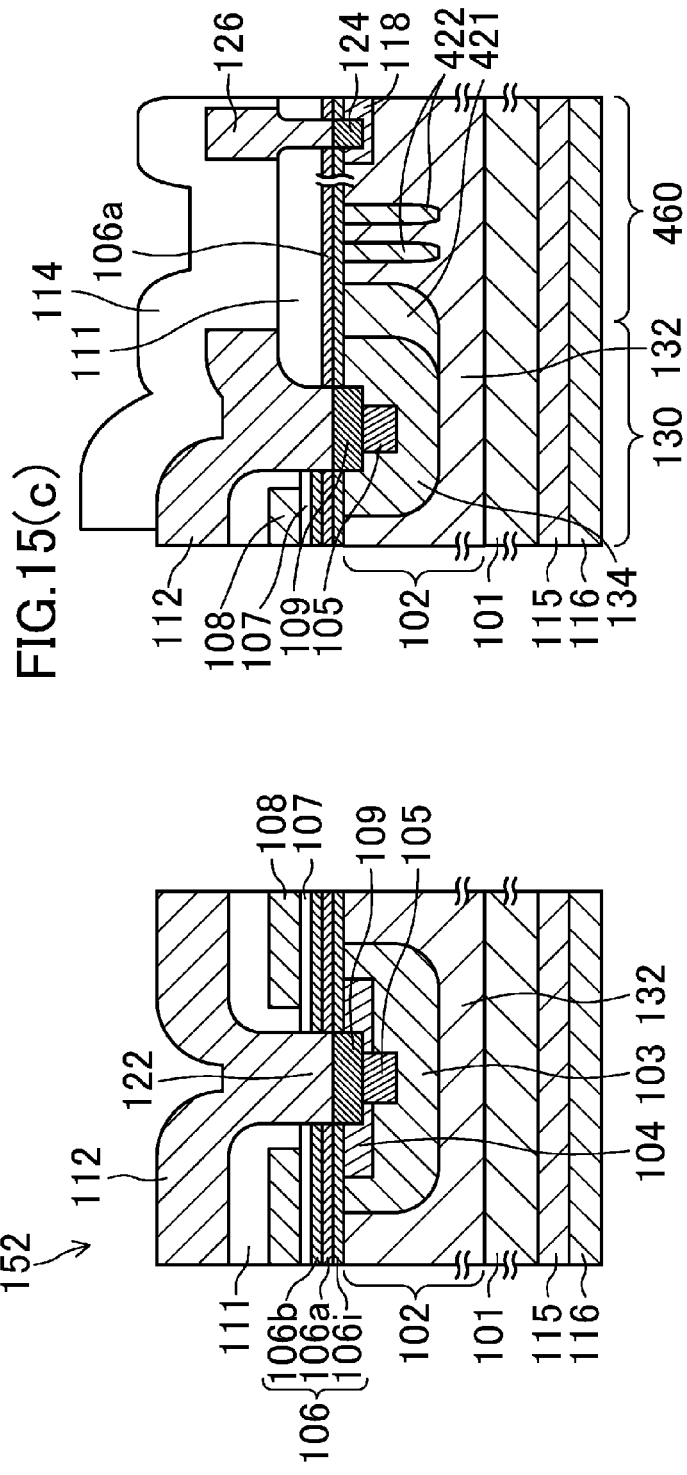
FIG.15(a)
FIG.15(b)
FIG.15(c)

ical Field

The present disclosure relates to semiconductor devices and methods for fabricating the semiconductor devices, and specifically relates to semiconductor devices and methods for fabricating the semiconductor devices which withstand high voltage or high current.

BACKGROUND ART

Vertical transistors are suitable as transistors which withstand high voltage, compared to lateral transistors, and are therefore applied to power elements used in the field of power electronics, for example.

Examples of the vertical transistors include metal-insulator-semiconductor field-effect transistors (MISFETs) or insulated gate bipolar transistors (IGBT).

Patent Document 1 discloses a silicon carbide semiconductor device including a surface channel layer placed on a surface of a base region such that a source region and a silicon carbide epitaxial layer are connected to each other in order to increase the channel mobility.

CITATION LIST

Patent Document

Patent Document 1: Japanese Unexamined Patent Publication No. H10-308510

SUMMARY OF THE INVENTION

Technical Problem

However, results of a study by the inventors of the present application showed that in the studied semiconductor device described above, the gate threshold voltage may vary in the wafer plane.

A semiconductor device and a method for fabricating the semiconductor device disclosed in the present specification are thus intended to reduce a reduction in a breakdown voltage and reduce variations in a gate threshold voltage in the wafer plane.

Solution to the Problem

To solve the above problems of the conventional devices, a semiconductor device disclosed in the present specification includes: a semiconductor substrate; a semiconductor layer provided on a principal surface of the semiconductor substrate and including a drift region of a first conductivity type, a body region of a second conductivity type provided at a position next to the drift region, and an impurity region of a first conductivity type provided at a position next to the body region; an epitaxial layer in contact with the body region; a gate insulating film provided at a position facing the body region with the epitaxial layer interposed therebetween; and a gate electrode provided at a position facing the epitaxial layer with the gate insulating film interposed therebetween, wherein the epitaxial layer includes an interface epitaxial layer in contact with the body region, a first epitaxial layer in contact with the interface epitaxial layer, and a second epitaxial layer in contact with the first epitaxial layer, and a first conductivity type impurity concentration of the interface epitaxial layer is higher than a first conductivity type impurity concentration of the first epitaxial layer, and lower than a first conductivity type impurity concentration of the second epitaxial layer.

Further, a method for fabricating a semiconductor device disclosed in the present specification includes: the steps of: forming, on a principal surface of a semiconductor substrate, a semiconductor layer including a drift region of a first conductivity type, a body region of a second conductivity type at a position next to the drift region, and an impurity region of a first conductivity type at a position next to the body region, forming an epitaxial layer in contact with the body region, forming a gate insulating film at a position facing the body region with the epitaxial layer interposed therebetween, and forming a gate electrode at a position facing the epitaxial layer with the gate insulating film interposed therebetween, wherein the step of forming the epitaxial layer includes the steps of forming an interface epitaxial layer in contact with the body region, forming a first epitaxial layer in contact with the interface epitaxial layer, and forming a second epitaxial layer in contact with the first epitaxial layer, and a first conductivity type impurity concentration of the interface epitaxial layer is higher than a first conductivity type impurity concentration of the first epitaxial layer, and lower than a first conductivity type impurity concentration of the second epitaxial layer.

Advantages of the Invention

According to the semiconductor device and the method for fabricating the semiconductor device disclosed in the present specification, it is possible to reduce variations in a gate threshold voltage in the wafer plane.

BRIEF DESCRIPTION OF THE DRAWINGS

FIG. 13(a) is a schematic plan view of a semiconductor device of the third embodiment. FIG. 13(b) is a schematic cross-section of a unit cell which forms the semiconductor device of the third embodiment. FIG. 13(c) is a schematic cross-section taken along the line XIIIc-XIIIc of FIG. 13(a), illustrating a region near a terminal of the semiconductor device.

FIG. 14(a) is a schematic plan view of a semiconductor device of the first variation of the present disclosure. FIG. 14(b) is a schematic cross-section of a unit cell which forms the semiconductor device of the first variation of the present disclosure. FIG. 14(c) is a schematic cross-section taken along the line XIVc-XIVc of FIG. 14(a), illustrating a region near a terminal of the semiconductor device.

FIG. 15(a) is a schematic plan view of a semiconductor device of the second variation of the present disclosure. FIG. 15(b) is a schematic cross-section of a unit cell which forms the semiconductor device of the second variation of the present disclosure. FIG. 15(c) is a schematic cross-section taken along the line XVc-XVc of FIG. 15(a), illustrating a region near a terminal of the semiconductor device.

DESCRIPTION OF EMBODIMENTS (How the Inventors of the Present Disclosure Arrived at the Present Invention)

The inventors of the present invention conducted studies to reduce variations in a threshold voltage of a semiconductor device which includes, as a channel layer, an epitaxial layer on a semiconductor layer. The studies showed that in forming an n-type epitaxial layer on an n-type impurity layer by epitaxial growth method, a layer having a high n-type impurity concentration (hereinafter referred to as an "interface epitaxial layer" or a "pile-up layer") was formed at an interface between the n-type impurity layer and the n-type epitaxial layer without intention. The pile-up layer is generated even in the case where the epitaxial layer is formed on a p-type impurity layer.

Figure 16A:
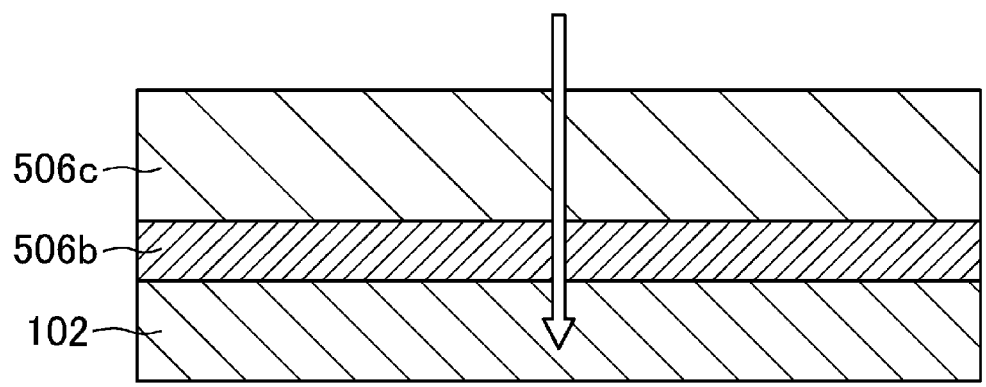
FIG. 16(a) is a study example, illustrating a cross-section of an epitaxial layer used in SIMS.
Figure 16B:
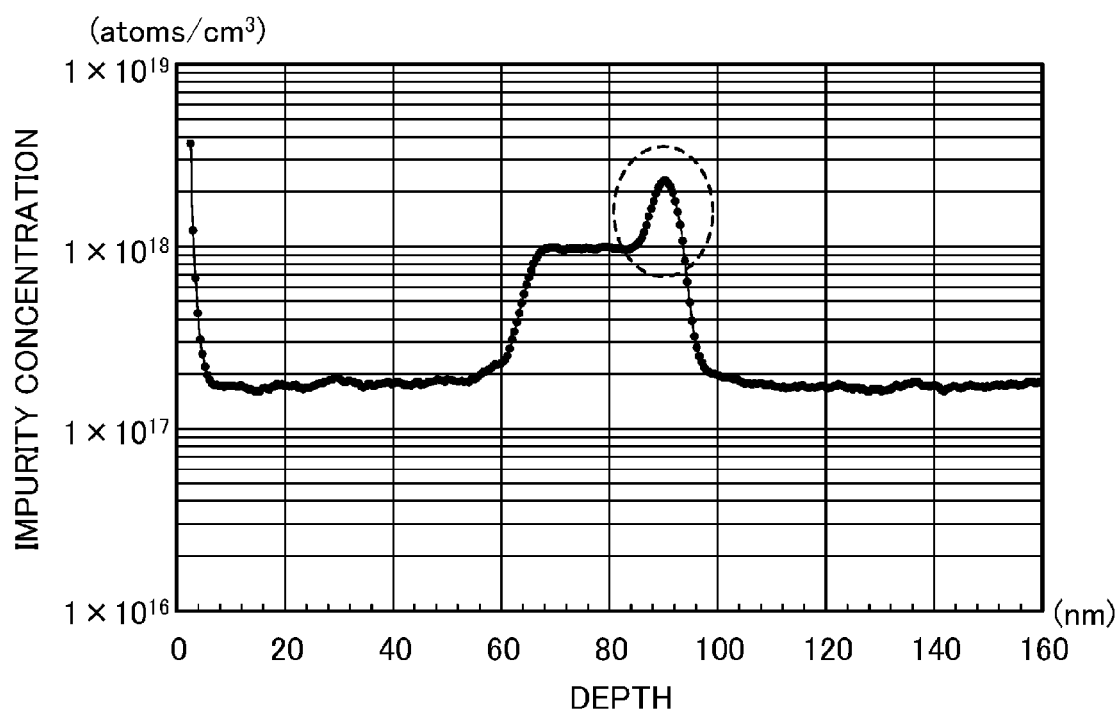
FIG. 16(b) is a graph showing an impurity profile of the epitaxial layer of the study example.
Figure 17A:
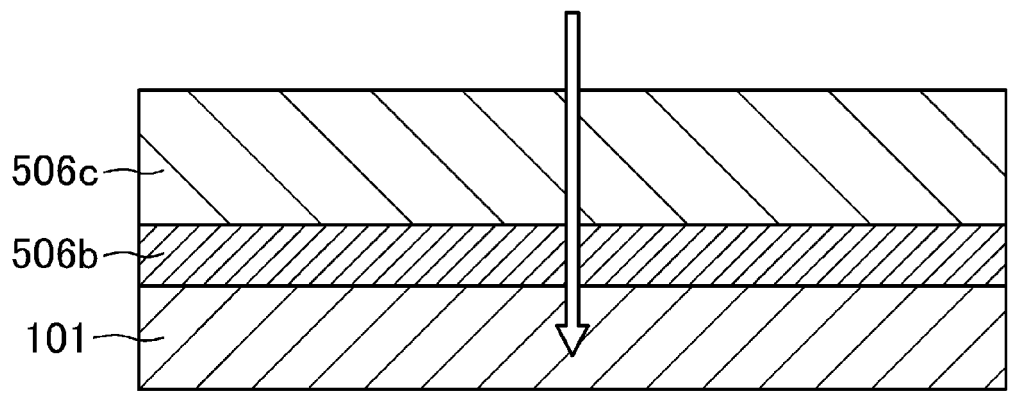
FIG. 17(a) is a study example, illustrating a cross-section of another epitaxial layer used in SIMS.
Figure 17B:
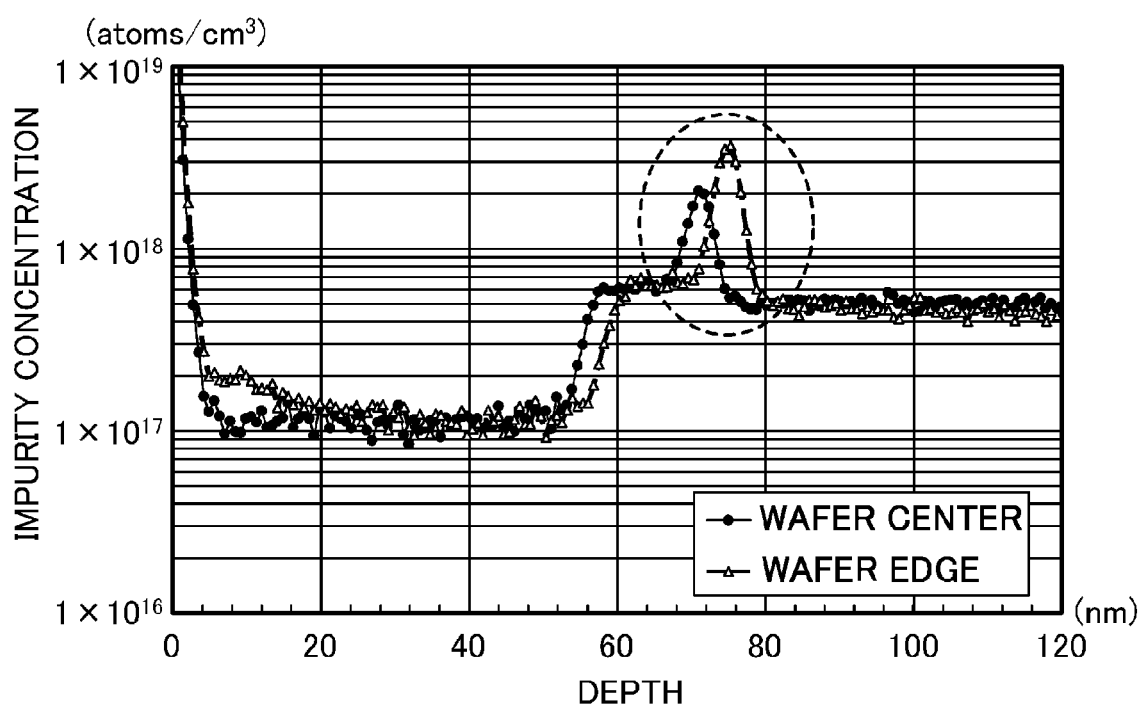
FIG. 17(b) is a graph showing an impurity profile of the another epitaxial layer of the study example.

FIG. 16 and FIG. 17 show the impurity profiles of epitaxial layers of study examples which were measured by secondary ion mass spectrometry (SIMS). FIG. 16(a) and FIG. 17(a) show cross-sectional configurations of samples used in the SIMS. FIG. 16(b) and FIG. 17(b) show the results of nitrogen concentration profiles of the samples measured by SIMS.

The sample shown in FIG. 16(a) was prepared by sequentially and successively forming, as an epitaxial layer, a high concentration layer 506b and a low concentration layer 506c by, for example, chemical vapor deposition (CVD) on a semiconductor layer 102 doped with a low concentration n-type impurity. As the semiconductor layer 102, a SiC layer of a nitrogen concentration of less than $1 \times 10^{17}$ cm$^{-3}$ which is epitaxially formed on a 4H—SiC substrate having a diameter of about 7.6 cm (i.e., 3 inches) was used. The temperature during the formation of the high concentration layer 506b and the low concentration layer 506c was set to 1550° C., and the pressure was set to 200 hPa. The gas flow rate during the formation of the high concentration layer 506b was 20 ml/min silane (SiH$_4$), 8 ml/min propane (C$_3$H$_8$), and 50 ml/min nitrogen (N$_2$), all under standard conditions (0° C., 1 atm). The gas flow rate during the formation of the low concentration layer 506c was 20 ml/min SiH$_4$, 8 ml/min C$_3$H$_8$, and 0 ml/min N$_2$, all under standard conditions (0° C., 1 atm). The thicknesses of the high concentration layer 506b and the low concentration layer 506c were about 20 nm and about 60 nm, respectively. The arrow in the drawing indicates the direction of the SIMS.

FIG. 16(b) shows the results of measurement of the sample shown in FIG. 16(a) by SIMS. The impurity which was measured is nitrogen with which the epitaxial layer was doped. The horizontal axis of FIG. 16(b) indicates the depth from the surface of the sample.

FIG. 16(b) indicates that there exists, around 68 nm to 85 nm deep, the high concentration layer 506b which contains nitrogen at a high and approximately uniform concentration. Further, there exists a peak, around 90 nm deep, which contains nitrogen at a higher concentration than the high concentration layer 506b. These facts show that there exists a pile-up layer (an interface epitaxial layer) whose impurity concentration is extremely high near the interface between the semiconductor substrate 101 and the high concentration layer 506b as an epitaxial layer, that is, at the beginning of the growth of the epitaxial layer.

The sample shown in FIG. 17(a) was prepared by sequentially and successively forming, as an epitaxial layer, a high concentration layer 506b and a low concentration layer 506c by CVD on a semiconductor substrate 101 doped with a high concentration impurity. As the semiconductor substrate 101, a 4H—SiC substrate of a nitrogen concentration of about $8 \times 10^{17}$ cm$^{-3}$ and having a diameter of about 7.6 cm was used. The temperature during the formation of the layers was set to 1550° C., and the pressure was set to 200 hPa. The gas flow rate during the formation of the high concentration layer 506b was 20 ml/min SiH$_4$, 8 ml/min C$_3$H$_8$, and 50 ml/min N$_2$, all under standard conditions (0° C., 1 atm). The gas flow rate during the formation of the low concentration layer 506c was 20 ml/min SiH$_4$, 8 ml/min C$_3$H$_8$, and 0 ml/min N$_2$, all under standard conditions (0° C., 1 atm). The thicknesses of the high concentration layer 506b and the low concentration layer 506c were about 20 nm and about 60 nm, respectively. The arrow in the drawing indicates the direction of the SIMS.

FIG. 17(b) shows the results of measurement of the sample shown in FIG. 17(a) by SIMS. The impurity which was measured was nitrogen with which the epitaxial layer was doped. The horizontal axis of FIG. 17(b) indicates the depth from the surface of the sample. In FIG. 17(b), the black dots (•) show the measurement results at a central portion of the wafer, and the white triangles (Δ) show the measurement results at an edge portion of the wafer. Specifically, the measurement at the edge portion of the wafer was conducted in a region that is 30 mm off a central position of the wafer. FIG. 17(b) indicates, similar to FIG. 16(b), that there exists the high concentration layer 506b which contains nitrogen at a high and approximately uniform concentration, and there exists a peak which contains nitrogen at a higher concentration than the high concentration layer 506b near the interface between the high concentration layer 506b and the semiconductor substrate 101. These facts show, similar to FIG. 16(b), that there exists a pile-up layer (an interface epitaxial layer) whose impurity concentration is extremely high near the interface between the semiconductor substrate 101 and the high concentration layer 506b as an epitaxial layer, that is, at the beginning of the growth of the epitaxial layer.

Further, as shown in FIG. 17(b), the height of the peak of the nitrogen concentration in the edge portion of the wafer is higher than the height of the peak of the nitrogen concentration in the central portion of the wafer. This means that the nitrogen concentration of the pile-up layer increases from the central portion of the wafer to the edge portion of the wafer.

Due to the effect of the pile-up layer, a sheet dose of the epitaxial layer, that is, a value of integral of the impurity concentration of the epitaxial layer, may significantly vary from a desired value, in the semiconductor device of the study example. Thus, in the case where a MISFET is fabricated using the epitaxial layer as a channel layer, a desired gate threshold voltage may not be obtained, and the gate threshold voltage may vary in the wafer plane. Particularly in the case where the epitaxial layer includes an high concentration layer doped with an impurity, such as a layer containing an impurity at a concentration of $1 \times 10^{17}$ cm$^{-3}$ or more, the impurity concentration of the pile-up layer is significantly high.

In FIG. 16(b) and FIG. 17(b), the impurity concentrations of the semiconductor layer 102 and the low concentration layer 506c are around from $1 \times 10^{17}$ cm$^{-3}$ to $2 \times 10^{17}$ cm$^{-3}$. These values are impurity concentrations of background of SIMS. It is confirmed by a carrier concentration measurement using capacitance-voltage (CV) method that the carrier concentration of the low concentration layer 506c is less than $1 \times 10^{17}$ cm$^{-3}$. Further, the reason why the impurity concentrations are high near the surfaces of the samples of FIG. 16(b) and FIG. 17(b) (about 0 nm to 10 nm deep) is because of effects of contaminants, etc., adhering to the surfaces of the samples.

The inventors of the present invention found that the reason why the pile-up layer was formed was that when a lot of impurities (for example, nitrogen gas) are supplied from the beginning of the epitaxial growth, the impurities (for example, nitrogen gas) are absorbed in the epitaxial layer more than expected because at the beginning of the epitaxial growth, the epitaxial growth is not stable yet and the epitaxial layer glows slowly. Further, the reason why the impurity concentration of the pile-up layer significantly vary in the wafer plane may be due to crystalline quality of the wafer, distribution of the amount of damage from ion implantation, and distribution of temperatures during epitaxial growth.

To prevent the formation of the pile-up layer, the growth rate of the epitaxial layer may be accelerated at the beginning of the formation, for example. In this case, however, although it is possible to prevent the formation of the pile-up layer, a stable growth mode cannot be obtained and other problems such as easy occurrence of defects in the epitaxial layer may be caused. Specifically, for example, in the case where the source gas is excessively supplied, or in the case where the epitaxial layer is grown in an accretionary growth mode or a two-dimensional nucleus growth mode by adjusting conditions of the epitaxial growth, such as a growth temperature, a growth pressure and a material ratio (i.e., a ratio of carbon (C)/silicon (Si)), the growth rate of the epitaxial layer at the beginning of the growth is not slow, and the pile-up layer is not easily formed near the interface. However, the epitaxial layer formed in such a mode contains a lot of stacking faults and dislocations in the layer, which may cause a reduction in yield of the semiconductor device.

The inventors of the present invention conducted intensive studies to solve the above problems to find a semiconductor device and a method for fabricating the semiconductor device which will be described below, as a method for forming a quality epitaxial layer with a controlled impurity concentration of a pile-up layer, by making the epitaxial layer have a layered structure.

The above descriptions are made to increase understanding of embodiments of the present disclosure, and not intended to limit the present disclosure.

(General Description of Embodiments)

A semiconductor device disclosed in the present specification includes an epitaxial layer in contact with a body region. The epitaxial layer includes an interface epitaxial layer in contact with the body region, a first epitaxial layer in contact with the interface epitaxial layer, and a second epitaxial layer in contact with the first epitaxial layer. The first conductivity type impurity concentration of the interface epitaxial layer is higher than the first conductivity type impurity concentration of the first epitaxial layer, and is lower than the first conductivity type impurity concentration of the second epitaxial layer.

In the semiconductor device of the present disclosure, the first conductivity type impurity concentration of the interface epitaxial layer is higher than the first conductivity type impurity concentration of the first epitaxial layer, and is lower than the first conductivity type impurity concentration of the second epitaxial layer. That is, the first conductivity type impurity concentration of the first epitaxial layer is lower than the first conductivity type impurity concentration of the second epitaxial layer. It is therefore possible to reduce a supply amount of an impurity gas at the beginning of the epitaxial growth of the epitaxial layer, and reduce the impurity concentration of the interface epitaxial layer (a pile-up layer) in the epitaxial layer near the interface with the body region. Further, a gate threshold voltage can be controlled due to the provision of the second epitaxial layer whose impurity concentration is higher than the impurity concentrations of the interface epitaxial layer and the first epitaxial layer. It is therefore possible to form an epitaxial layer with a desired sheet dose and good uniformity within the plane. As a result, shifts in the gate threshold voltage of the semiconductor device can be reduced, and variations in the gate threshold voltage in the wafer plane can be reduced.

Further, stacking faults in the epitaxial layer can be reduced due to the interface epitaxial layer provided near the interface between the body region and the epitaxial layer, and due to the configuration in which the first conductivity type impurity concentration of the interface epitaxial layer is higher than the first conductivity type impurity concentration of the first epitaxial layer, and lower than the first conductivity type impurity concentration of the second epitaxial layer. The interface epitaxial layer can be obtained by growing it in a step-flow growth mode, in which growth rate is slow, at the beginning of the growth of the epitaxial layer, for example.

In the semiconductor device disclosed in the present specification, the first conductivity type impurity concentration of the first epitaxial layer may be less than $1 \times 10^{17}$ cm$^{-3}$. When the first epitaxial layer has such a first conductivity type impurity concentration, changes of the impurity concentration in the first epitaxial layer scarcely affect the gate threshold voltage of the semiconductor device, and therefore, variations in the gate threshold voltage in the wafer plane can be reduced with more reliability.

In the semiconductor device disclosed in the present specification, the impurity concentration in the interface epitaxial layer may be higher than the first conductivity type impurity concentration of the body region.

In the semiconductor device disclosed in the present specification, the first conductivity type impurity concentration of the first epitaxial layer may be lower than the first conductivity type impurity concentration of a drift region. When the first epitaxial layer has such a first conductivity type impurity concentration, extension of a depletion layer at the terminal is not restricted, and therefore, the low field intensity is kept low at the terminal. Thus, a reduction in the breakdown voltage of the semiconductor device can be reduced with more reliability.

The semiconductor device disclosed in the present specification further includes a trench in the semiconductor layer, and the epitaxial layer may be provided at a position which covers at least part of a side surface of the trench.

In the semiconductor device disclosed in the present specification, the semiconductor layer and the epitaxial layer may be made of silicon carbide.

The semiconductor device disclosed in the present specification further includes a cell provided on the semiconductor substrate, and a terminal provided at a position on the semiconductor substrate and surrounding the cell, wherein the cell includes a semiconductor layer, an epitaxial layer, a gate insulating film, a gate electrode, a first ohmic electrode, and a second ohmic electrode; the first ohmic electrode is electrically connected to an impurity region; the second ohmic electrode is provided on a back side of the semiconductor substrate; the interface epitaxial layer in contact with the semiconductor layer, and the first epitaxial layer in contact with the interface epitaxial layer are provided at the terminal, and the second epitaxial layer may not be provided at the terminal. Since the second epitaxial layer having an impurity concentration higher than an impurity concentration of the first epitaxial layer is not provided on the semiconductor layer at the terminal as described above, a reduction in the breakdown voltage of the semiconductor device can be reduced.

In the semiconductor device disclosed in the present specification, the terminal includes a ring region of a second conductivity type provided in the semiconductor layer, and the first epitaxial layer may be in contact with the ring region. With this configuration, it is possible to achieve a semiconductor device including a terminal with a field limiting ring (FLR) structure.

Other structures, except the FLR structure, included in the terminal disclosed in the present specification may be a junction termination edge (JTE) structure or a junction termination extension (JTE) structure, or a guard ring assisted-reduced surface field structure (hereinafter referred to as a "GRA-RESURF structure").

The semiconductor device disclosed in the present specification may have a planar gate structure, or may be a trench gate structure.

In the semiconductor device disclosed in the present specification, materials for forming the semiconductor layer and the epitaxial layer are not specifically limited. The semiconductor layer and the epitaxial layer may be made of a material selected from a wide band gap semiconductor, such as silicon carbide (SiC), gallium nitride (GaN), and diamond (C), and silicon, etc.

A method for fabricating a semiconductor device disclosed in the present specification includes the steps of: forming, on a principal surface of a semiconductor substrate, a semiconductor layer including a drift region of a first conductivity type, a body region of a second conductivity type at a position next to the drift region, and an impurity region of a first conductivity type at a position next to the body region; forming an epitaxial layer in contact with the body region; forming a gate insulating film at a position facing the body region with the epitaxial layer interposed therebetween; and forming a gate electrode at a position facing the epitaxial layer with the gate insulating film interposed therebetween, wherein the step of forming the epitaxial layer includes the steps of forming an interface epitaxial layer in contact with the body region, forming a first epitaxial layer in contact with the interface epitaxial layer, and forming a second epitaxial layer in contact with the first epitaxial layer; a first conductivity type impurity concentration of the interface epitaxial layer is higher than a first conductivity type impurity concentration of the first epitaxial layer, and lower than a first conductivity type impurity concentration of the second epitaxial layer.

According to the method for fabricating the semiconductor device of the present disclosure, the first conductivity type impurity concentration of the interface epitaxial layer is higher than the first conductivity type impurity concentration of the first epitaxial layer, and lower than the first conductivity type impurity concentration of the second epitaxial layer. That is, the first conductivity type impurity concentration of the first epitaxial layer is lower than the first conductivity type impurity concentration of the second epitaxial layer. It is therefore possible to reduce a supply amount of an impurity gas at the beginning of the epitaxial growth of the epitaxial layer, and reduce the impurity concentration of the interface epitaxial layer (a pile-up layer) in the epitaxial layer near the interface with the body region. Further, a gate threshold voltage can be controlled due to the provision of the second epitaxial layer whose impurity concentration is higher than the impurity concentrations of the interface epitaxial layer and the first epitaxial layer. It is therefore possible to form an epitaxial layer with a desired sheet dose and good uniformity within the plane. As a result, shifts in the gate threshold voltage of the semiconductor device can be reduced, and variations in the gate threshold voltage in the wafer plane can be reduced.

In the method for fabricating the semiconductor device of the present specification, the epitaxial layer may be formed by CVD.

In the method for fabricating the semiconductor device of the present specification, the step of forming the interface epitaxial layer and the step of forming the first epitaxial layer may be successively performed without changing an amount of dopant gas to be supplied.

In the method for fabricating the semiconductor device of the present specification, in the step of forming the epitaxial layer, an amount of the dopant gas supplied during growth of the first epitaxial layer may be one tenth or less of an amount of the dopant gas supplied during growth of the second epitaxial layer, or no dopant gas may be supplied during growth of the first epitaxial layer.

According to the method of the present disclosure, no impurity is supplied, or a supply amount of the impurity is restricted in the beginning of the epitaxial growth of the epitaxial layer. Thus, less impurity is absorbed in the epitaxial layer in the beginning of the epitaxial growth, and a pile-up layer is not easily introduced at the interface between the epitaxial layer and the body region.

According to the method of the present disclosure, since less impurity is absorbed in the epitaxial layer in the beginning of the epitaxial growth, it is possible to reduce the impurity concentration of the interface epitaxial layer (the pile-up layer) near the interface between the epitaxial layer and the body region.

In the method for fabricating the semiconductor of the present specification, the semiconductor substrate further includes a cell provided on the semiconductor substrate, and a terminal provided at a position on the semiconductor substrate and surrounding the cell, wherein the method may further include, after the step of forming the epitaxial layer, a step of etching part of the epitaxial layer to expose the first epitaxial layer at the terminal.

According to the method of the present disclosure, it is possible to obtain a semiconductor device in which at the terminal, the first epitaxial layer is in contact with the semiconductor layer formed on the principal surface of the semiconductor substrate, and the second epitaxial layer is not formed at the terminal. In the obtained semiconductor device, the second epitaxial layer having an impurity concentration higher than an impurity concentration of the first epitaxial layer is not provided on the semiconductor layer at the terminal, and therefore, a reduction in the breakdown voltage of the semiconductor device can be reduced.

Embodiments of the present invention will be described in detail below using the drawings.

(First Embodiment)

[Structure of Semiconductor Device]

Figure 1:
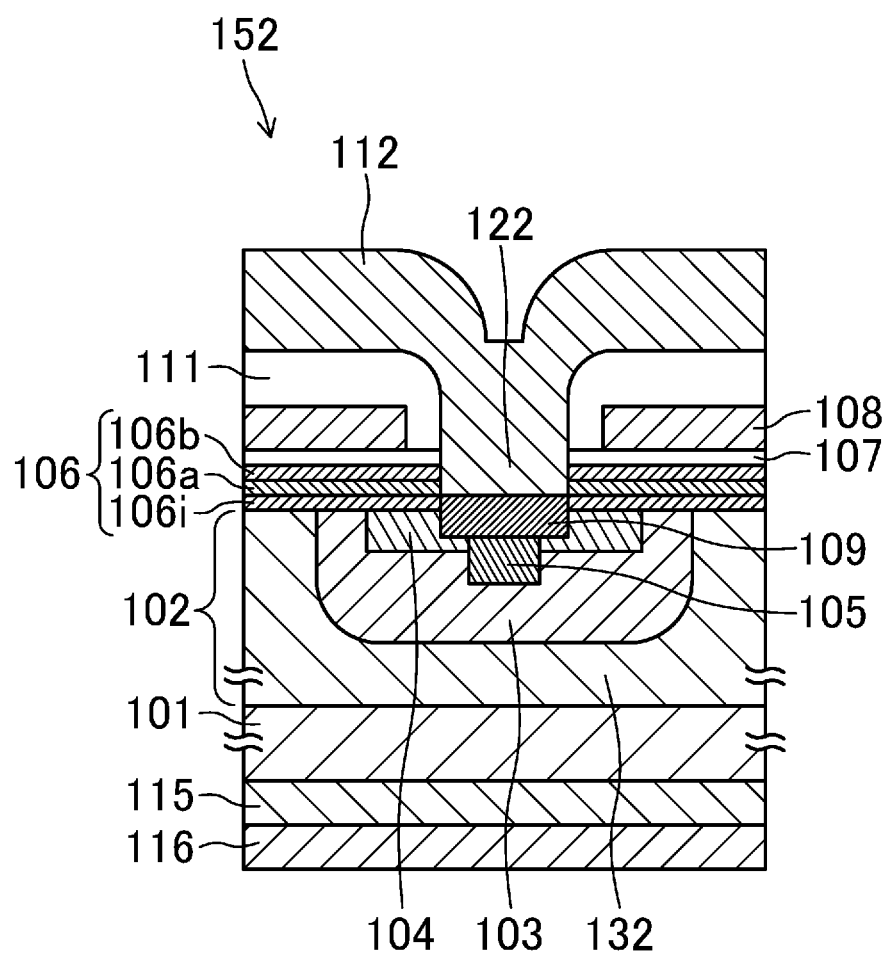
FIG. 1 is a schematic cross-section illustrating a main part of a semiconductor device of the first embodiment.

FIG. 1 shows a schematic cross-section of a unit cell 152 of a semiconductor device of the present embodiment.

As shown in FIG. 1, an example MISFET in which the unit cell 152 has a vertical structure (hereinafter referred to as a "vertical MISFET") will be described in the present embodiment.

First, a configuration of the semiconductor device will be described with reference to FIG. 1.

A semiconductor layer 102 is provided on a principal surface of the semiconductor substrate 101. The semiconductor layer 102 includes a drift region 132 of a first conductivity type (e.g., n-type), and a body region 103 of a second conductivity type (e.g., p-type) is provided in an upper portion of the drift region 132 so as to be in contact with the drift region 132. The body region 103 touches the surface of the semiconductor layer 102.

A source region 104 of a first conductivity type is provided in an upper portion of the body region 103. The source region 104 touches the surface of the semiconductor layer 102. The source region 104 corresponds to an impurity region of the present specification. A source electrode 109 is electrically connected to the source region 104. The source electrode 109 corresponds to a first ohmic electrode of the present specification.

A body contact region 105 of a second conductivity type may be provided in the body region 103. The body contact region 105 may be electrically connected to the source electrode 109.

An epitaxial layer 106 is provided on the semiconductor layer 102 so as to touch at least part of the body region 103 and at least part of the source region 104. A channel region is formed at a portion of the epitaxial layer 106 which is interposed between the body region 103 and a gate electrode 108. The epitaxial layer 106 includes an interface epitaxial layer (a pile-up layer) 106$i$ in contact with the body region 103, a first epitaxial layer 106$a$ in contact with the interface epitaxial layer 106$i$, and a second epitaxial layer 106$b$ in contact with the first epitaxial layer 106$a$.

A first conductivity type impurity concentration of the interface epitaxial layer 106$i$ is higher than a first conductivity type impurity concentration of the first epitaxial layer 106$a$, and lower than a first conductivity type impurity concentration of the second epitaxial layer 106$b$. The interface epitaxial layer 106$i$ has a thickness of 5 nm, and an impurity concentration of $4\times10^{17}$ cm$^{-3}$, for example.

The first conductivity type impurity concentration of the interface epitaxial layer 106$i$ may be higher than a first conductivity type impurity concentration of the body region 103. The first conductivity type impurity concentration of the first epitaxial layer 106$a$ may be lower than a first conductivity type impurity concentration of the drift region 132.

The first conductivity type impurity concentration of the first epitaxial layer 106$a$ is set to be lower than the first conductivity type impurity concentration of the second epitaxial layer 106$b$. For example, the first epitaxial layer 106$a$ and the second epitaxial layer 106$b$ may each have a thickness of 20 nm, and impurity concentrations of $1\times10^{16}$ cm$^{-3}$ and $1\times10^{18}$ cm$^{-3}$, respectively. By setting the first conductivity type impurity concentration of the first epitaxial layer 106$a$ to be lower than the first conductivity type impurity concentration of the second epitaxial layer 106$b$, it is possible to reduce an increase in the impurity concentration of the interface epitaxial layer 106$i$ near the interface with the body region 103 during epitaxial growth of the epitaxial layer 106.

In the present embodiment, the epitaxial layer 106 has a three-layer structure including the interface epitaxial layer 106$i$, the first epitaxial layer 106$a$, and the second epitaxial layer 106$b$, but is not limited to this structure. The epitaxial layer 106 may have another epitaxial layer on the second epitaxial layer 106$b$.

A gate insulating film 107 is provided on the epitaxial layer 106. A gate electrode 108 is provided on the gate insulating film 107. The gate electrode 108 is provided at least above a portion where the body region 103 and the epitaxial layer 106 touch each other.

An interlayer insulating film 111 is provided so as to cover the gate electrode 108. An upper wiring 112 is provided on the interlayer insulating film 111. The upper wiring 112 is connected to the source electrode 109 via a contact hole 122 formed in the interlayer insulating film 111. A drain electrode 115 is formed on the back side of the semiconductor substrate 101. The drain electrode 115 corresponds to a second ohmic electrode of the present specification. A back side wiring 116 may also be provided on the back side of the drain electrode 115.

[Method for Fabricating Semiconductor Device]

A method for fabricating the semiconductor device according to the present embodiment will be described below with reference to FIG. 2($a$) to FIG. 2($f$) and FIG. 3($a$) to FIG. 3($f$).

First, a semiconductor substrate 101 of a first conductivity type (e.g., n-type) is prepared. For example, an n-type 4H—SiC off-cut substrate with a low resistance, i.e., about 0.01 Ωcm to 0.03 Ωcm, can be used as the semiconductor substrate 101. The principal surface of the semiconductor substrate 101 may be tilted from a (0001)Si plane by 4° or 8°.

Figure 2A:
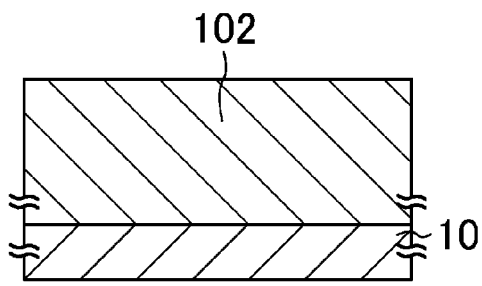
FIG. 2(a) to FIG. 2(f) are schematic cross-sections illustrating a method for fabricating the semiconductor device of the first embodiment in the order of steps.

As shown in FIG. 2(a), a first conductivity type semiconductor layer 102 with a high resistance is epitaxially grown on the principal surface of the semiconductor substrate 101. A buffer layer made of SiC containing a first conductivity type impurity at a high concentration may be formed on the semiconductor substrate 101 before forming the semiconductor layer 102. The impurity concentration of the buffer layer is $1 \times 10^{18}$ cm$^{-3}$, for example, and a thickness of the buffer layer is 0.5 μm. The semiconductor layer 102 is made of n-type 4H—SiC, for example, and has an impurity concentration of $1 \times 10^{16}$ cm$^{-3}$ and a thickness of 10 μm, for example.

Figure 2D:
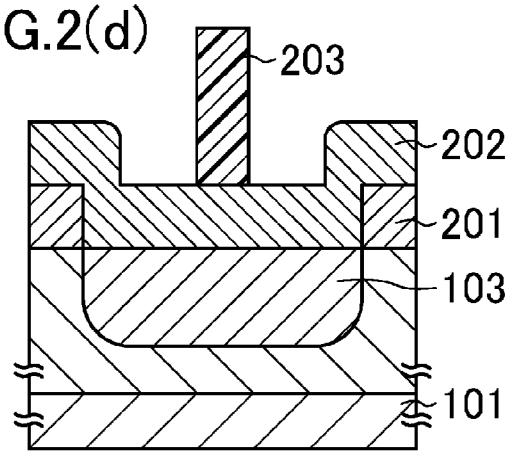
Figure 2B:
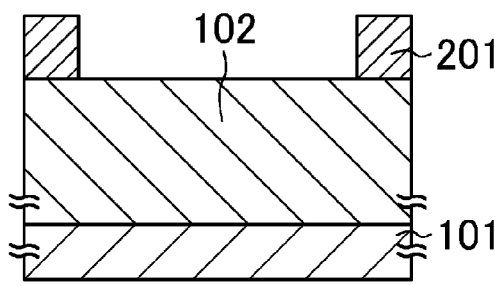

Next, as shown in FIG. 2(b), a mask film 201 made of, e.g., silicon oxide (SiO$_2$) is selectively formed on the semiconductor layer 102.

Figure 2E:
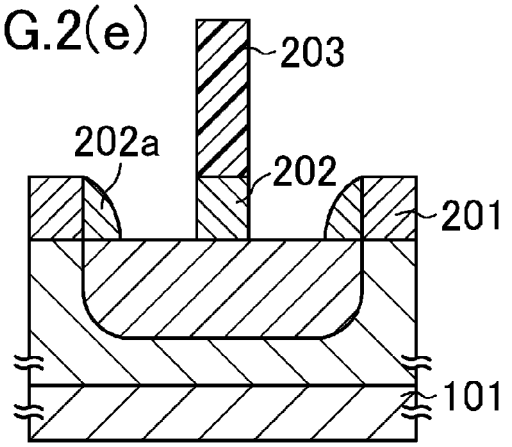
Figure 2C:
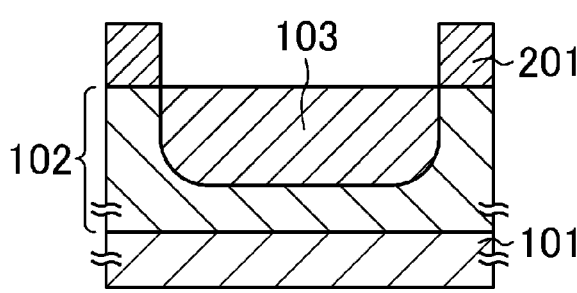

Next, as shown in FIG. 2(c), aluminum (Al) ions, for example, are implanted in the semiconductor layer 102 to form a body region 103 of a second conductivity type (e.g., p-type).

Next, as shown in FIG. 2(d), another mask film 202 is deposited on the entire surface of the mask film 201. After that, a resist mask 203 is formed by patterning a resist above the body region 103 such that a region where a contact region is to be formed is covered. The mask film 201 and the mask film 202 are preferably made of materials which allow the mask film 202 to be selectively dry etched with respect to the mask film 201. For example, the material of the mask film 201 may be SiO$_2$, and the material of the mask film 202 may be polysilicon.

Next, as shown in FIG. 2(e), the mask film 202 is dry etched using the resist mask 203. Due to a so-called self-aligned process, part of the mask film 202 remains on a side surface of the mask film 201, and a sidewall 202a is formed from the mask film 202 as a result.

Figure 2F:
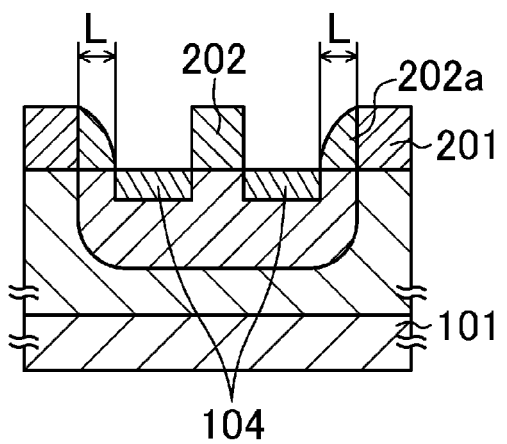

Next, as shown in FIG. 2(f), after the resist mask 203 is removed, the body region 103 is doped with impurities by, for example, implanting nitrogen (N) ions, thereby forming a source region 104 of a first conductivity type. In the case where the source region 104 is formed by ion implantation, ion implantation conditions, such as implantation energy and dosage amount of N ions, are decided such that a region with an impurity concentration of about $5 \times 10^{19}$ cm$^{-3}$ has a thickness of about 200 nm to 300 nm. In this structure, a length corresponding to the channel of the MISFET, that is, the length L shown in FIG. 2(f) which defines the gate length, can be controlled with accuracy. The length L is regulated by the width of the sidewall 202a, and is about 0.5 μm, for example.

Figure 3A:
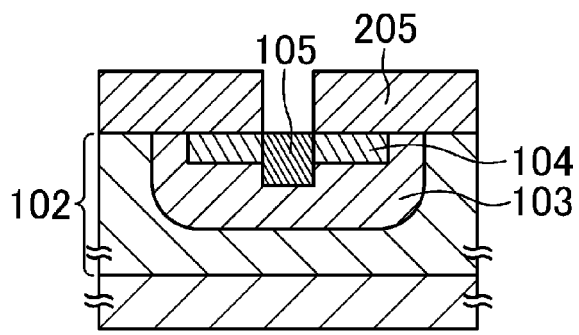
FIG. 3(a) to FIG. 3(f) are schematic cross-sections illustrating a method for fabricating the semiconductor device of the first embodiment in the order of steps.

Next, as shown in FIG. 3(a), the mask films 201, 202 and the sidewall 202a are removed. Thereafter, another mask film 205 is formed on the semiconductor layer 102. The mask film 205 is made of SiO$_2$, for example, and is provided with an opening in a region where a body contact region is to be formed. Al ions, for example, are implanted in the semiconductor layer 102 using the mask film 205, thereby forming a body contact region 105. The implantation conditions may be decided such that a dopant concentration is about $1 \times 10^{20}$ cm$^{-3}$ and a depth is about 400 nm, for example. The body contact region 105 may be formed in the body region 103. The mask film 205 is removed after the ion implantation.

After that, according to necessity, a mask having an opening may be formed at a position between adjacent body regions 103, and N ions, for example, may be implanted in the semiconductor layer 102 to form a junction field effect transistor (JFET) region. The ion implantation conditions in forming the JILT region may be decided such that a dopant concentration is about $1 \times 10^{17}$ cm$^{-3}$ and an implantation depth is in a range of from about 0.6 μm to about 1 μm, for example.

The above ion implantation step may be conducted under the condition in which the semiconductor substrate 101 is heated to 200° C. or more, for example.

Subsequently, the implanted impurity ions are activated by activation annealing under a high temperature of about from 1600° C. to 1900° C. It is possible to reduce surface roughness of the semiconductor substrate 101 caused by the activation annealing by forming, before the activation annealing, a carbon film (not shown) on a surface of the semiconductor substrate 101 having an implantation region. In the case where a carbon film is formed on the surface, the carbon film is removed after the activation annealing. The carbon film can be removed by being exposed to oxygen plasma, for example. Subsequently, according to necessity, the surface of the semiconductor substrate 101 may be cleaned by slightly oxidizing the surface and thereafter removing a thermal oxidation film obtained in a thickness of about 15 nm, for example.

Figure 3B:
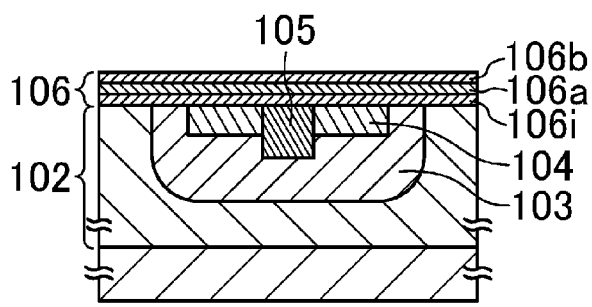

Next, as shown in FIG. 3(b), an epitaxial layer 106 is epitaxially grown on the entire surface of the semiconductor layer 102 which includes the body region 103, the source region 104, and the body contact region 105. In the present embodiment, as described above, the epitaxial layer 106 has a structure in which the interface epitaxial layer 106i, the first epitaxial layer 106a, and the second epitaxial layer 106b are sequentially formed on the body region 103. The first conductivity type impurity concentration of the interface epitaxial layer 106i is set to be higher than the first conductivity type impurity concentration of the first epitaxial layer 106a, and lower than the first conductivity type impurity concentration of the second epitaxial layer 106b. The interface epitaxial layer 106i has a thickness of 5 nm and an impurity concentration of $4 \times 10^{17}$ cm$^{-3}$, for example. The first conductivity type impurity concentration of the first epitaxial layer 106a is set to be lower than the first conductivity type impurity concentration of the second epitaxial layer 106b. For example, the first epitaxial layer 106a and the second epitaxial layer 106b each have a thickness of 20 nm, and have impurity concentrations of $1 \times 10^{16}$ cm$^{-3}$ and $1 \times 10^{18}$ cm$^{-3}$, respectively.

By setting the first conductivity type impurity concentration of the first epitaxial layer 106a to be lower than the first conductivity type impurity concentration of the second epitaxial layer 106b, it is possible to form an interface epitaxial layer 106i having an impurity concentration lower than the impurity concentration of the second epitaxial layer 106b, near the interface of the epitaxial layer 106 with the body region 103 during the epitaxial growth of the epitaxial layer 106.

The epitaxial growth method for forming the epitaxial layer 106 will be specifically described. To form the epitaxial layer 106, a silicon-based gas (e.g., a silane gas), a carbon-based gas (e.g., a propane gas) and a dopant gas (e.g., a nitrogen gas in the case of n-type gas) are supplied, while heating the semiconductor substrate 101, using a chemical vapor deposition (CVD) device, for example. The growth conditions are that the growth temperature is about from 1450° C. to 1650° C., and the growth pressure is from 50 hPa to 300 hPa, for example. The flow rate of each source gas is that 10 ml/min to 30 ml/min for SiH$_4$; 3 ml/min to 15 ml/min for C$_3$H$_8$; and 50 l/min to 200 l/min for H$_2$, under standard conditions (0° C., 1 atm). Step-flow growth is applied as the epitaxial growth mode. In the present embodiment, to prevent impurities from being excessively introduced in the interface epitaxial layer 106i at the beginning of the epitaxial growth, dopant gas is not supplied during growth of the first epitaxial layer 106a, but is supplied only during growth of the second epitaxial layer 106b, for example. Alternatively, the amount of dopant gas to be supplied during growth of the first epitaxial layer 106a is set to one tenth or less of the amount of dopant gas to be supplied during growth of the second epitaxial layer 106b, for example.

The time when no dopant gas is supplied, or the time when the supply amount of the dopant gas is reduced, may correspond to growth delay time at the beginning of growth of the epitaxial layer 106. The "growth delay time" as used herein is time from the start of the epitaxial growth to when the growth rate of the epitaxial layer stabilizes. In the growth delay time, several molecular layers or so are formed.

The supply amount of the dopant gas may be gradually increased from zero during growth of the first epitaxial layer 106a.

Due to the above epitaxial growth, it is possible to provide the epitaxial layer 106 having a structure in which the interface epitaxial layer 106i, the first epitaxial layer 106a, and the second epitaxial layer 106b are sequentially formed, and in which the first conductivity type impurity concentration of the interface epitaxial layer 106i is set to be higher than the first conductivity type impurity concentration of the first epitaxial layer 106a, and lower than the first conductivity type impurity concentration of the second epitaxial layer 106b.

In the present specification, the interface epitaxial layer 106i is such a layer which can be present within 20 nm from the interface between the body region 103 and the epitaxial layer 106, and has a first conductivity type impurity concentration higher than the first conductivity type impurity concentration of the first epitaxial layer 106a, and lower than the first conductivity type impurity concentration of the second epitaxial layer 106b.

The thickness and the impurity concentration of each of the first epitaxial layer 106a and the second epitaxial layer 106b are appropriately adjusted according to a target value of a gate threshold voltage of the MISFET. The epitaxial layer 106 may have another epitaxial layer on the second epitaxial layer 106b. Further, the impurity concentration may not be abruptly changed at the interface between the first epitaxial layer 106a and the second epitaxial layer 106b. In the case where the impurity concentration is not abruptly changed, a portion having an impurity concentration of less than $1\times10^{17}$ cm$^{-3}$ may be considered as the first epitaxial layer 106a, and a portion having an impurity concentration of $1\times10^{17}$ cm$^{-3}$ or more may be considered as the second epitaxial layer 106b, for example.

Figure 3C:
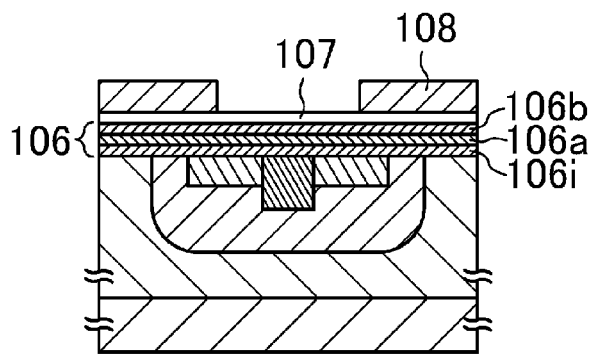

Next, as shown in FIG. 3(c), a gate insulating film 107 is formed on the epitaxial layer 106 by, for example, thermal oxidation. Subsequently, a gate electrode 108 is selectively formed on a desired region of the gate insulating film 107. The gate electrode 108 is formed by, for example, depositing a polycrystal silicon film doped with phosphorus (P) at a concentration of about $7\times10^{20}$ cm$^{-3}$, and thereafter dry etching the polycrystal silicon film using a mask (not shown). The thickness of the polycrystal silicon film is about 500 nm, for example. The gate electrode 108 is provided so as to cover at least a portion of the epitaxial layer 106 which functions as a channel.

Figure 3D:
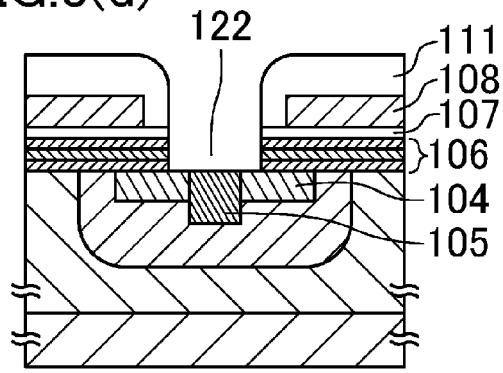

Next, as shown in FIG. 3(d), an interlayer insulating film 111 is deposited so as to cover the semiconductor layer 102, as well as the gate electrode 108, by CVD, for example. The interlayer insulating film 111 may be made of SiO$_2$, for example. The thickness of the interlayer insulating film 111 is 1.5 μm, for example. Subsequently, the interlayer insulating film 111, the gate insulating film 107, and the epitaxial layer 106 are sequentially dry etched using a mask (not shown), thereby forming a contact hole 122 exposing the body contact region 105 and part of the source region 104.

Figure 3E:
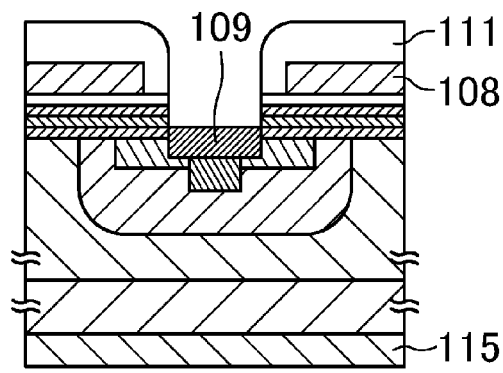

Next, a nickel (Ni) film with a thickness of about 100 nm, for example, is deposited on the entire surface of the interlayer insulating film 111, thereby forming a Ni film on the bottom surface of the contact hole 122. Subsequently, the Ni film is subjected to a heat treatment for five minutes at a temperature of 950° C. under an inert atmosphere, for example, to have the nickel film react with the surface of the silicon carbide. After that, the nickel film on the interlayer insulating film 111 is removed to form a source electrode 109 made of nickel silicide on the bottom of the contact hole 122 as shown in FIG. 3(e). A nickel film, for example, is deposited on the back side of the semiconductor substrate 101, as well, and the nickel film is subjected to a similar heat treatment to react with silicon carbide, and a drain electrode 115 is thereby formed.

Figure 3F:
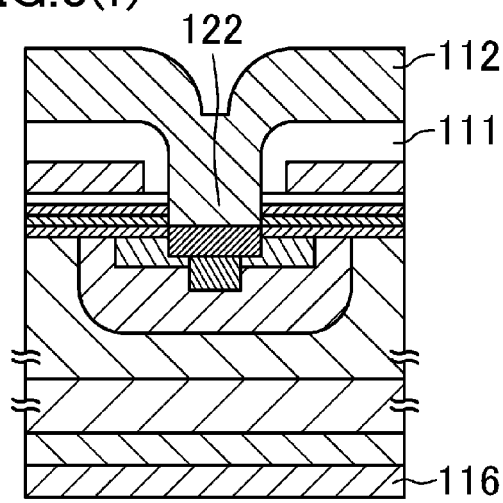

Next, as shown in FIG. 3(f), an aluminum (Al) film having a thickness of about 4 μm is deposited on the interlayer insulating film 111 so as to connect with the source electrode 109 exposed from the contact hole 122. Subsequently, the deposited aluminum film is etched to have a desired pattern, thereby forming an upper wiring 112 made of aluminum. A back side wiring 116 for die bonding may be formed on the back side of the drain electrode 115. The back side wiring 116 may be a multilayer film in which titanium (Ti)/nickel (Ni)/silver (Ag) are sequentially formed from a side closer to the drain electrode 115, for example. The semiconductor device in FIG. 1 can be obtained in this manner.

According to the semiconductor device of the present embodiment, the epitaxial layer 106 has a layered structure in which the interface epitaxial layer 106i, the first epitaxial layer 106a, and the second epitaxial layer 106b are sequentially layered, and the first conductivity type impurity concentration of the interface epitaxial layer 106i is higher than the first conductivity type impurity concentration of the first epitaxial layer 106a, and lower than the first conductivity type impurity concentration of the second epitaxial layer 106b. With this structure, it is possible to form the epitaxial layer 106 with a desired sheet dose and good uniformity within the plane, while maintaining good crystalline quality of the epitaxial layer 106. As a result, shifts in the gate threshold voltage and variations in the gate threshold voltage in the wafer plane can be reduced, while ensuring a reduction of a leakage current in the semiconductor device and reliability of the semiconductor device.

(Example of First Embodiment)

An example of the first embodiment will be described below with reference to the drawings.

In the present example, the effect of reducing the introduction of a pile-up layer due to the first epitaxial layer 106a was studied by SIMS.

Figure 4A:
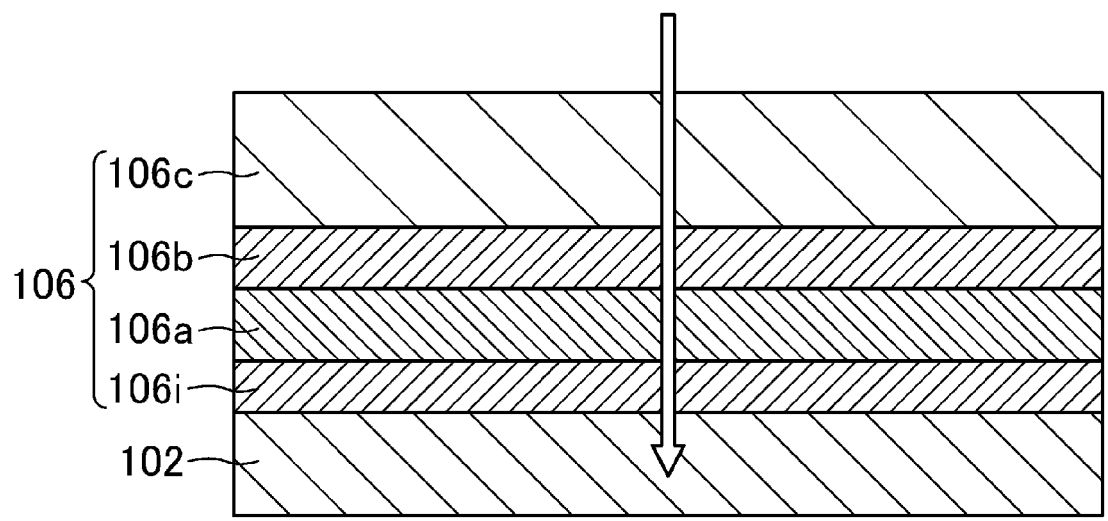
FIG. 4(a) is an example of the first embodiment, illustrating a cross-section of an epitaxial layer used in secondary ion mass spectrometry (SIMS).

FIG. 4 shows the results of SIMS in which an impurity profile of an epitaxial layer of the present example, which is epitaxially grown on a semiconductor layer doped with an n-type impurity at a low concentration, was measured. FIG. 4(a) is a cross-sectional structure of a sample used in the SIMS. The sample in FIG. 4(a) was prepared by sequentially and successively forming, as the epitaxial layer 106, an interface epitaxial layer 106i, a first epitaxial layer 106a, a second epitaxial layer 106b, and a third epitaxial layer 106c by CVD, for example, on a semiconductor layer 102 with a low n-type impurity concentration. The semiconductor layer 102 is a semiconductor layer epitaxially grown on a 4H—SiC substrate having a diameter of about 7.6 cm so as to have a nitrogen concentration of less than $1\times10^{17}$ cm$^{-3}$. Epitaxial growth in a step-flow growth mode is started on the semiconductor layer to form the interface epitaxial layer 106i at the beginning of the growth, and thereafter, the first epitaxial layer 106a is formed. The first conductivity type impurity concentration of the interface epitaxial layer 106i is higher than the first conductivity type impurity concentration of the first epitaxial layer 106a at this time. By making the first epitaxial layer 106a have a lower impurity concentration, it is possible to reduce an increase in the impurity concentration of the interface epitaxial layer 106i. As a result, the first conductivity type impurity concentration of the interface epitaxial layer 106i can be lower than the first conductivity type impurity concentration of the second epitaxial layer 106b. The temperature during the formation of the epitaxial layer was set to 1550° C., and the pressure was set to 200 hPa. The gas flow rate during the formation of the interface epitaxial layer 106i was 20 ml/min $SiH_4$, 8 ml/min $C_3H_8$, and 0 ml/min $N_2$, all under standard conditions (0° C., 1 atm). The growth time of the interface epitaxial layer 106i was 10 seconds. The gas flow rate of the first epitaxial layer 106a was 20 ml/min $SiH_4$, 8 ml/min $C_3H_8$, and 0 ml/min $N_2$, all under standard conditions (0° C., 1 atm). The growth time of the first epitaxial layer 106a was 20 seconds. In other words, although the growth time differs between the interface epitaxial layer 106i and the first epitaxial layer 106a, the epitaxial growth conditions of the growth recipes are same between the interface epitaxial layer 106i and the first epitaxial layer 106a. The gas flow rate during the formation of the second epitaxial layer 106b was 20 ml/min $SiH_4$, 8 ml/min $C_3H_8$, and 80 ml/min $N_2$, all under standard conditions (0° C., 1 atm). The growth time of the second epitaxial layer 106b was 20 seconds. The gas flow rate during the formation of the third epitaxial layer 106c was 20 ml/min $SiH_4$, 8 ml/min $C_3H_8$, and 0 ml/min $N_2$, all under standard conditions (0° C., 1 atm). The growth time of the third epitaxial layer 106c was 70 seconds. As a result, the thicknesses of the interface epitaxial layer 106i, the first epitaxial layer 106a, the second epitaxial layer 106b, and the third epitaxial layer 106c are about 10 nm, about 20 nm, about 20 nm, and about 70 nm, respectively. The arrow in the drawing indicates the direction of the SIMS.

Figure 4B:
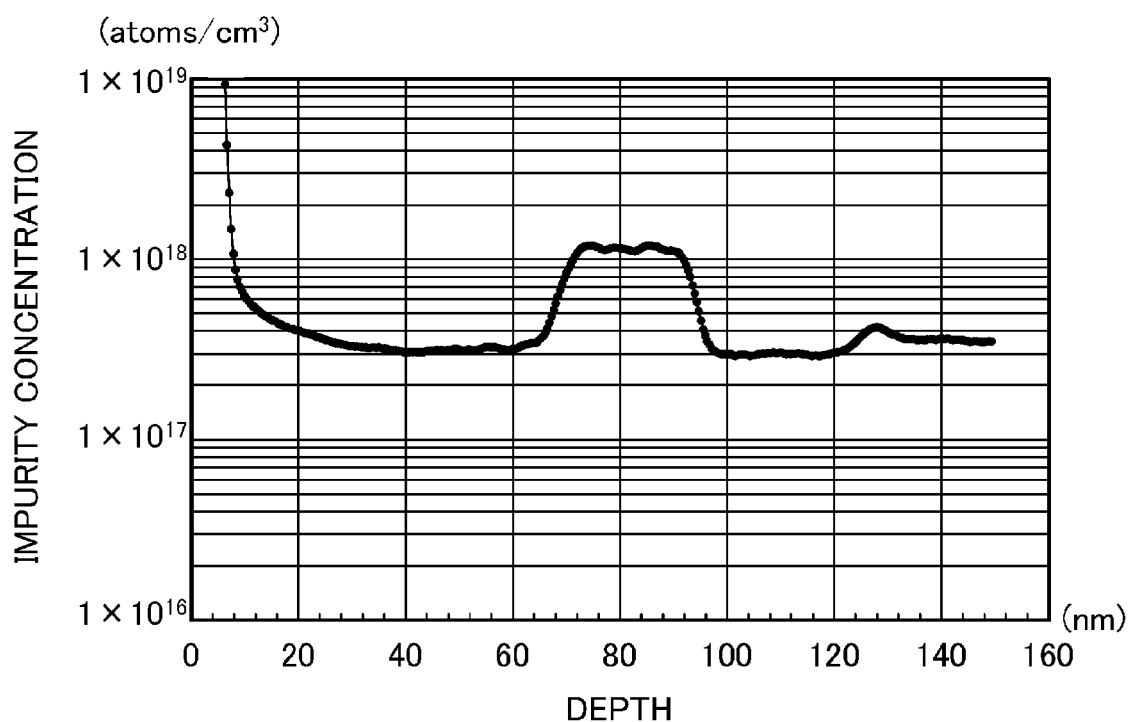
FIG. 4(b) is a graph showing an impurity profile of the epitaxial layer in the example of the first embodiment.

FIG. 4(b) shows the results of measurement of the sample shown in FIG. 4(a) by SIMS. The impurity which was measured is nitrogen with which the epitaxial layer was doped. The horizontal axis of FIG. 4(b) indicates the depth from the surface of the sample, and the vertical axis indicates an impurity concentration of nitrogen. As shown in FIG. 4(b), it is acknowledged that the interface epitaxial layer 106i, as an epitaxial layer having a small impurity peak, is present in the depth from about 120 nm to 130 nm, that the first epitaxial layer 106a with a low impurity concentration is present in the depth from about 95 nm to 120 nm, that the second epitaxial layer 106b with a high impurity concentration is present in the depth from about 70 nm to 95 nm, and that the third epitaxial layer 106c with a low impurity concentration is present in the depth from about 0 nm to 70 nm. As known from this, the epitaxial layer 106 is formed almost as planned. It is also acknowledged that the impurity concentration of the interface epitaxial layer 106i is higher than the first conductivity type impurity concentration of the first epitaxial layer 106a, and lower than the first conductivity type impurity concentration of the second epitaxial layer 106b. The layer that is present deeper than about 130 nm is the semiconductor layer 102.

Figure 5A:
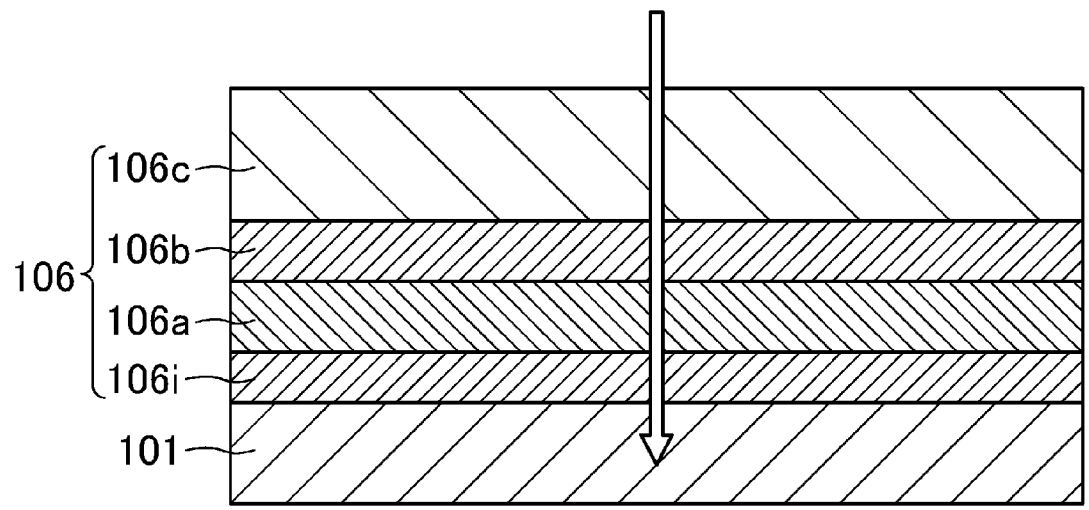
FIG. 5(a) is an example of the first embodiment, illustrating a cross-section of another epitaxial layer used in SIMS.

FIG. 5 shows the results of SIMS in which an impurity profile of an epitaxial layer epitaxially grown on a semiconductor substrate doped with an n-type impurity at a high concentration was measured. FIG. 5(a) is a cross-sectional structure of a sample used in the SIMS. The sample in FIG. 5(a) was prepared by sequentially and successively forming, as the epitaxial layer 106, an interface epitaxial layer 106i, a first epitaxial layer 106a, a second epitaxial layer 106b, and a third epitaxial layer 106c by CVD, for example, on the semiconductor substrate 101. A 4H—SiC substrate having a diameter of about 7.6 cm and containing nitrogen at a concentration of about $1 \times 10^{18}$ $cm^{-3}$ was used as the semiconductor substrate 101. The difference from the sample in FIG. 4 is that the underlayer on which a layer is epitaxially grown is changed from the semiconductor layer 102 to the semiconductor substrate 101.

The temperature during the formation of the epitaxial layer 106 was set to 1550° C., and the pressure was set to 200 hPa. The gas flow rate during the formation of the interface epitaxial layer 106i was 20 ml/min $SiH_4$, 8 ml/min $C_3H_8$, 0 ml/min $N_2$, all under standard conditions (0° C., 1 atm). The growth time of the first epitaxial layer 106i was 10 seconds. The gas flow rate during the formation of the first epitaxial layer 106a was 20 ml/min $SiH_4$, 8 ml/min $C_3H_8$, 0 ml/min $N_2$, all under standard conditions (0° C., 1 atm). The growth time of the interface epitaxial layer 106a was 10 seconds. The gas flow rate during the formation of the second epitaxial layer 106b was 20 ml/min $SiH_4$, 8 ml/min $C_3H_8$, and 80 ml/min $N_2$, all under standard conditions (0° C., 1 atm). The growth time of the second epitaxial layer 106b was 20 seconds. The gas flow rate of the third epitaxial layer 106c was 20 ml/min $SiH_4$, 8 ml/min $C_3H_8$, 0 ml/min $N_2$, all under standard conditions (0° C., 1 atm). The growth time of the third epitaxial layer 106c was 60 seconds. As a result, the thicknesses of the interface epitaxial layer 106i, the first epitaxial layer 106a, the second epitaxial layer 106b, and the third epitaxial layer 106c are about 5 nm, about 20 nm, about 20 nm, and about 60 nm, respectively. The arrow in the drawing indicates the direction of the SIMS.

Figure 5B:
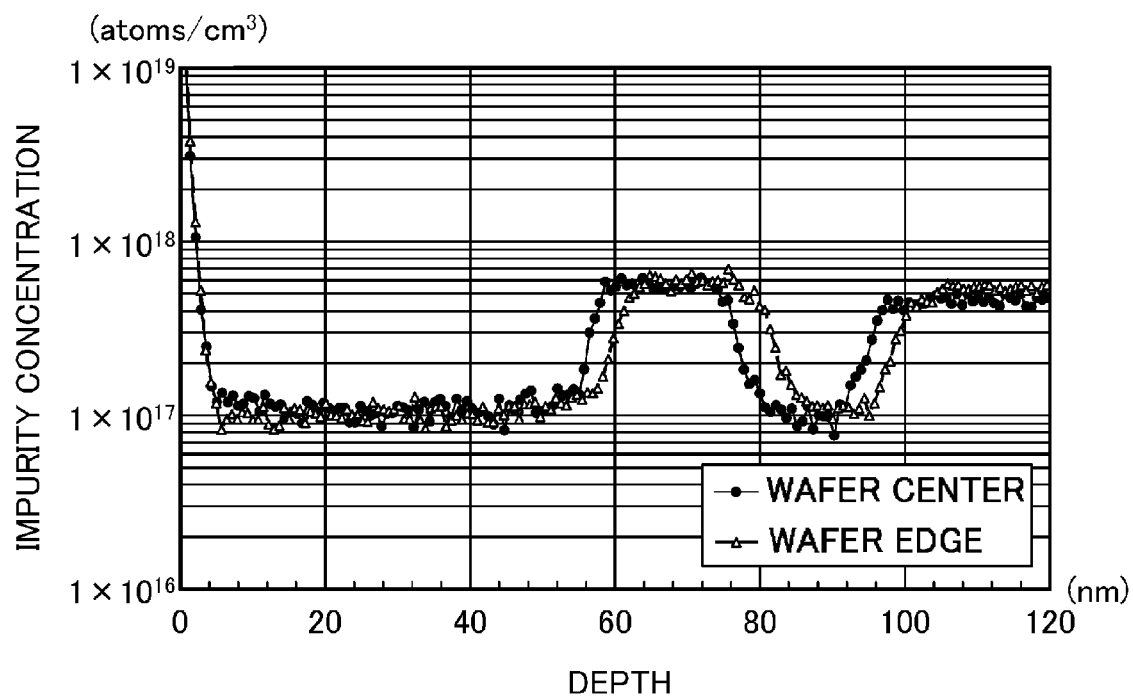
FIG. 5(b) is a graph showing an impurity profile of the another epitaxial layer in the example of the first embodiment.

FIG. 5(b) shows the results of measurement of the sample shown in FIG. 5(a) by SIMS. The impurity which was measured is nitrogen with which the epitaxial layer was doped. The horizontal axis of FIG. 5(b) indicates the depth from the surface of the sample. In FIG. 5(b), the black dots (•) show the measurement results at a central portion of the wafer, and the white triangles (Δ) show the measurement results at an edge portion of the wafer. As shown in FIG. 5(b), it is acknowledged from the curve corresponding to the central portion of the wafer that the first epitaxial layer 106a with a low impurity concentration is present in the depth from about 75 nm to 85 nm, that the second epitaxial layer 106b with a high impurity concentration is present in the depth from about 55 nm to 75 nm, and that the third epitaxial layer 106c with a low impurity concentration is present in the depth from about 0 nm to 55 nm. In the example of FIG. 5(a), the interface epitaxial layer 106i is formed on the semiconductor substrate 101 with a relatively high nitrogen impurity concentration. Thus, it is difficult to distinguish the interface between the interface epitaxial layer 106i and the semiconductor substrate 101 from the graph of FIG. 5(b). That is, the interface between the interface epitaxial layer 106i and the semiconductor substrate 101 cannot be distinguished since the nitrogen impurity concentration of the interface epitaxial layer 106i is on the order of $10^{17}$ $cm^{-3}$ and the nitrogen impurity concentration of the semiconductor substrate 101 is about $10^{18}$ $cm^{-3}$. However, the interface can be distinguished by, for example, focusing on the concentration of impurities other than nitrogen, such as tantalum (Ta) or iron (Fe), contained in the fabrication apparatus. Specifically, the interface epitaxial layer 106i contains such impurities more than the semiconductor substrate 101. Thus, it can be expected that there exists an interface epitaxial layer whose first conductivity type impurity concentration is higher than the first conductivity type impurity concentration of the first epitaxial layer 106a as a low concentration layer, at least at the beginning of growth of the epitaxial layer 106.

The measurement at the edge portion of the wafer was conducted in a region that is 30 mm off the central portion of the wafer. As shown in FIG. 5(b), the impurity profile is almost similar between the edge portion of the wafer and the central portion of the wafer.

Comparison between the measurement result at the central portion of the wafer and the measurement result at the edge portion of the wafer shows that values of the nitrogen concentration are almost the same between the respective epitaxial layers. It is thus found that variations in the nitrogen concentration in the wafer plane are small.

It is expected that, similar to this case, variations in the nitrogen concentration in the wafer plane are small also in the case where the epitaxial layer 106 is formed on a semiconductor layer with a nitrogen concentration of less than $1 \times 10^{17}$ $cm^{-3}$ which is epitaxially grown not on the semiconductor substrate 101 with a high impurity concentration, but on a 4H—SiC substrate having a diameter of about 7.6 cm.

In FIG. 4(b) and FIG. 5(b), the impurity concentrations of the first epitaxial layer 106a and the third epitaxial layer 106c are around from $1 \times 10^{17}$ $cm^{-3}$ to $2 \times 10^{17}$ $cm^{-3}$. These values are impurity concentrations of background of SIMS. It is confirmed by a carrier concentration measurement using capacitance-voltage (CV) method that the carrier concentrations of the first epitaxial layer 106a and the third epitaxial layer 106c are less than $1 \times 10^{17}$ $cm^{-3}$, specifically about $1 \times 10^{16}$ $cm^{-3}$. Further, the reason why the impurity concentrations are high near the surfaces of the samples of FIG. 4(b) and FIG. 5(b) (about 0 nm to 10 nm deep) is because of effects of contaminants, etc., adhering to the surfaces of the samples.

(Second Embodiment)

[Structure of Semiconductor Device]

A semiconductor device of the second embodiment will be described below with reference to the drawings.

Figure 6A:
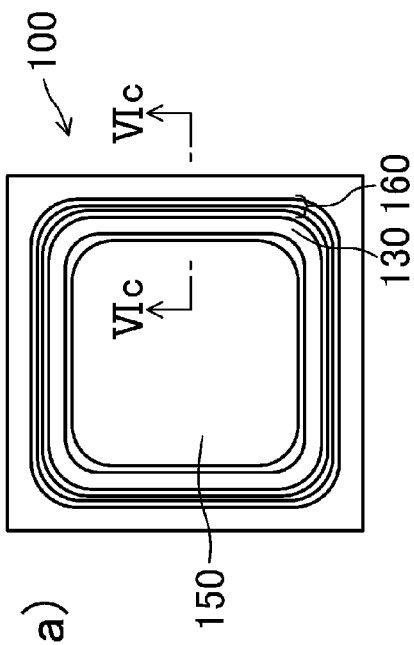
FIG. 6(a) is a schematic plan view of a semiconductor device of the second embodiment.
Figure 6B:
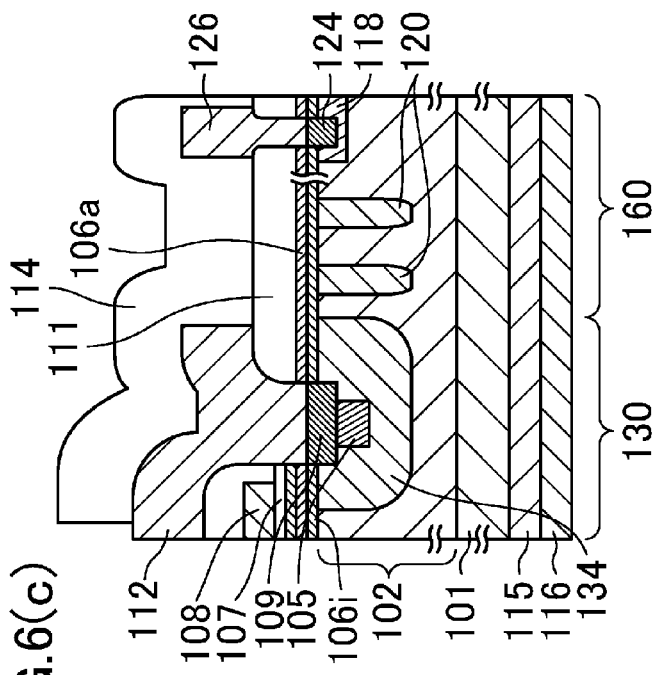
FIG. 6(b) is a schematic cross-section of a unit cell which forms the semiconductor device of the second embodiment.
Figure 6C:
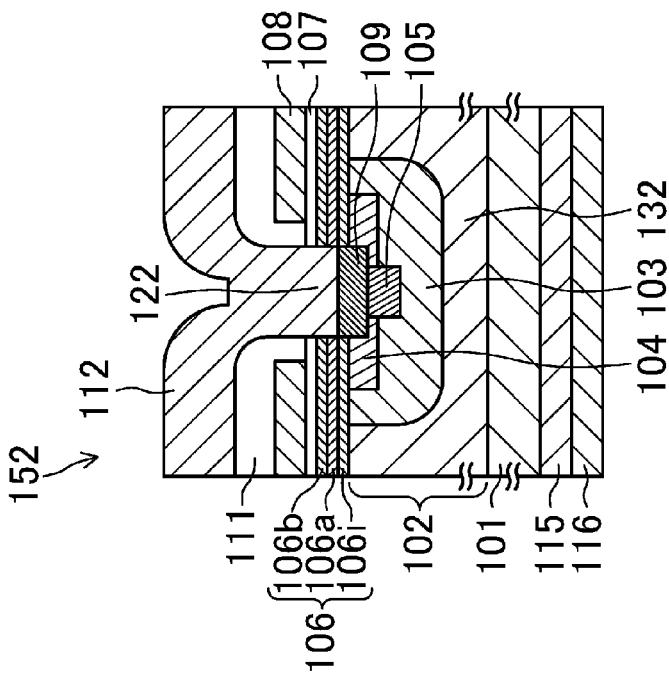
FIG. 6(c) is a schematic cross-section taken along the line VIc-VIc of FIG. 6(a), illustrating a region near a terminal of the semiconductor device.

FIG. 6(a) shows a schematic configuration of a semiconductor device 100 according to the present embodiment in plan view. FIG. 6(b) shows a schematic cross-sectional configuration of a unit cell 152 which forms a cell 150 of the semiconductor device 100. FIG. 6(c) shows a schematic cross-sectional configuration of a region near a terminal 160 of the semiconductor device 100.

The semiconductor device 100 of the present embodiment is mainly made of silicon carbide (SiC) semiconductor. The semiconductor device 100 includes a cell 150 having a function of an element, and the terminal 160 which complements a breakdown voltage of the cell 150. The cell 150 includes a plurality of unit cells 152. As shown in FIG. 6(a), the terminal 160 surrounds the cell 150 when viewed along the direction of a normal to the principal surface of the semiconductor substrate 101. The unit cell 152 shown in FIG. 6(b) has a configuration equivalent to the vertical MISFET of FIG. 1 described in the first embodiment.

The semiconductor device 100 of the present embodiment adopts a field limiting ring (FLR) structure as the terminal 160, for example. FIG. 6(c) shows a cross-sectional configuration taken along the line VIc-VIc of FIG. 6(a). As shown in FIG. 6(c), in the terminal 160, two ring regions 120 of a second conductivity type are formed in an upper portion of the semiconductor layer 102 and spaced apart from each other. The number of the ring regions 120 described herein is two, but the number of the ring regions 120 is not specifically limited. The ring regions 120 reduce electric field concentration in the cell 150, and reduce a reduction in a breakdown voltage. In FIG. 6(a), each of the ring regions 120 is a continuous annular region, but is not limited to this configuration. Each of the ring regions 120 may have a configuration in which a plurality of regions spaced from one another (a plurality of island regions) are annularly arranged. In this case, a desired breakdown voltage can be ensured with more reliability if the space between adjacent ones of the plurality of regions spaced apart from one another is designed such that depletion layers extending from the respective regions connect each other.

Of the epitaxial layer 106, the interface epitaxial layer 106i and the first epitaxial layer 106a are provided on the ring regions 120. Since the second epitaxial layer 106b having an impurity concentration higher than the impurity concentration of the first epitaxial layer 106a is not provided on the ring regions 120, it is possible to reduce a reduction of the breakdown voltage of the semiconductor device 100.

The semiconductor device 100 may have a diode portion 130 between the cell 150 and the terminal 160. In the diode portion 130, a pn-junction diode is formed due to a second conductivity type impurity region 134 and the first conductivity type semiconductor layer 102.

The ring regions 120 are covered by the interlayer insulating film 111. A first conductivity type stopper region 118 for preventing a depletion layer caused by pn junction from reaching a chip end of the semiconductor device 100, an upper wiring 126, and a contact electrode 124 which electrically connects the stopper region 118 and the upper wiring 126 may be provided at the chip end of the semiconductor device 100. The upper wiring 126 and the contact electrode 124 are provided in an opening formed in the interlayer insulating film 111. The upper wiring 112 and the upper wiring 126 are not directly in contact with each other.

A passivation film 114 is formed so as to cover the upper wiring 126 and part of the upper wiring 112. The passivation film 114 may cover at least part of the unit cell 152. Further, similar to the unit cell 152, a back side wiring 116 may be provided on the drain electrode 115.

[Method for Fabricating Semiconductor Device]

Next, a method for fabricating a semiconductor device according to the present embodiment will be described with reference to FIG. 7 to FIG. 11. In each drawing, (a1), (b1) and (c1) respectively show a cross-section of a cell in a fabrication step, and (a2), (b2) and (c2) respectively show a cross-section of a terminal in a fabrication step. The steps shown in (a2), (b2) and (c2) correspond to the steps shown in (a1), (b1) and (c1), respectively.

First, a semiconductor substrate 101 of a first conductivity type (e.g., n-type) is prepared. For example, an n-type 4H—SiC off-cut substrate with a low resistance, i.e., about 0.01 Ωcm to 0.03 Ωcm, can be used as the semiconductor substrate 101. The principal surface of the semiconductor substrate 101 may be tilted from a (0001)Si plane by 4° or 8°.

Figure 7:
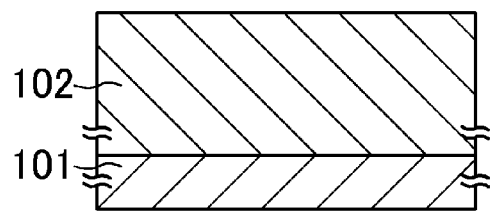
FIG. 7(a1) and FIG. 7(a2) to FIG. 7(c1) and FIG. 7(c2) are schematic cross-sections illustrating a method for fabricating the semiconductor device of the second embodiment in the order of steps.
Figure 7:
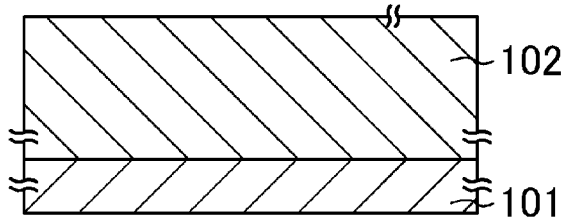
Figure 7:
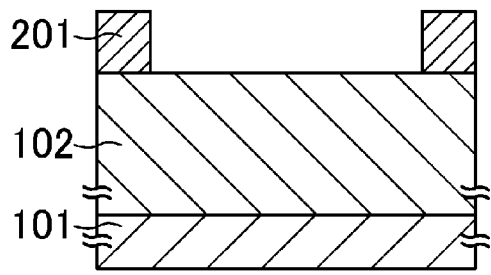
Figure 7:
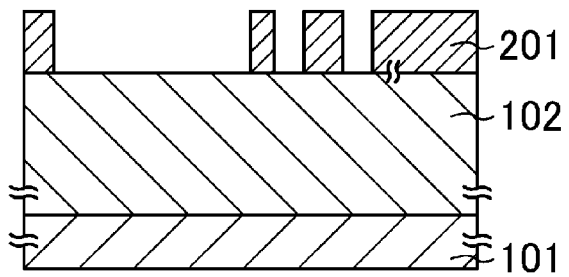
Figure 7:
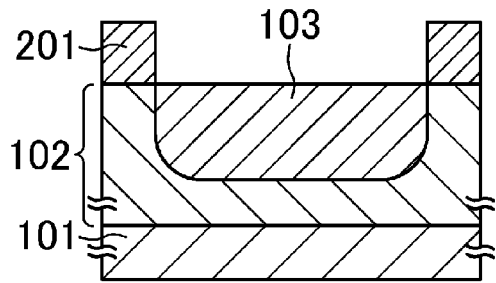
Figure 7:
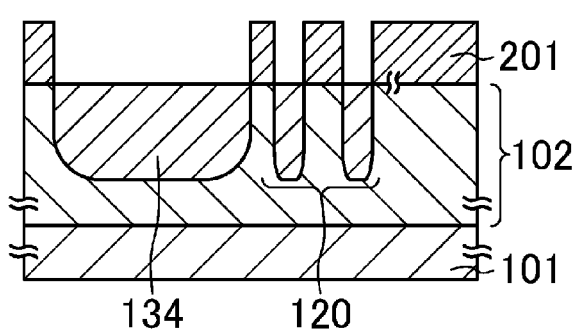

As shown in FIG. 7(a1) and FIG. 7(a2), a first conductivity type semiconductor layer 102 with a high resistance is epitaxially grown on the principal surface of the semiconductor substrate 101. A buffer layer made of SiC containing a first conductivity type impurity at a high concentration may be formed on the semiconductor substrate 101 before forming the semiconductor layer 102. The impurity concentration of the buffer layer is $1 \times 10^{18}$ $cm^{-3}$, for example, and a thickness of the buffer layer is 0.5 μm. The semiconductor layer 102 is made of n-type 4H—SiC, for example, and has an impurity concentration of $1 \times 10^{16}$ $cm^{-3}$ and a thickness of 10 μm, for example.

Next, as shown in FIG. 7(b1) and FIG. 7(b2), a mask film 201 made of, e.g., $SiO_2$ is selectively formed on the semiconductor layer 102.

Next, as shown in FIG. 7(c1), aluminum (Al) ions, for example, are implanted in the semiconductor layer 102 to form a body region 103 of a second conductivity type (e.g., p-type). A plurality of ring regions 120 and an impurity region 134 of a second conductivity type are simultaneously formed at this time as shown in FIG. 7(c2). Process can be simplified by performing ion implantation for forming the ring regions 120 simultaneously with ion implantation for forming the body region 103 as described above.

Figure 8:
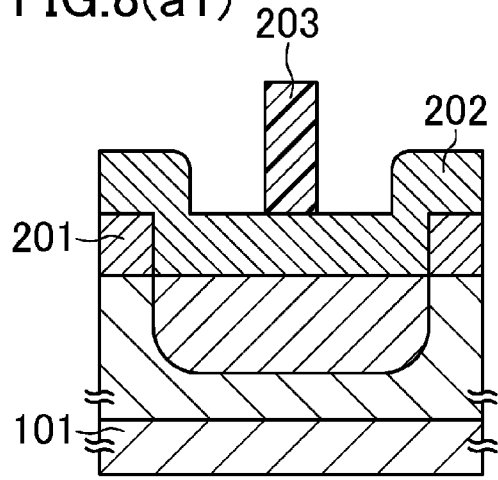
FIG. 8(a1) and FIG. 8(a2) to FIG. 8(c1) and FIG. 8(c2) are schematic cross-sections illustrating a method for fabricating the semiconductor device of the second embodiment in the order of steps.
Figure 8:
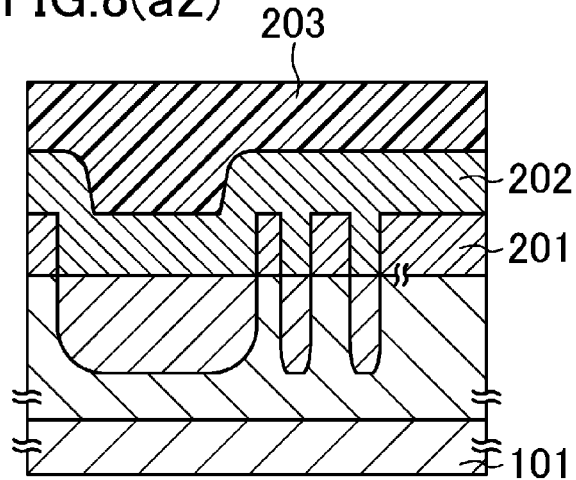
Figure 8:
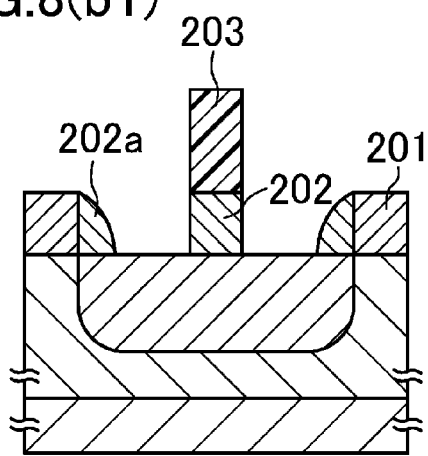
Figure 8:
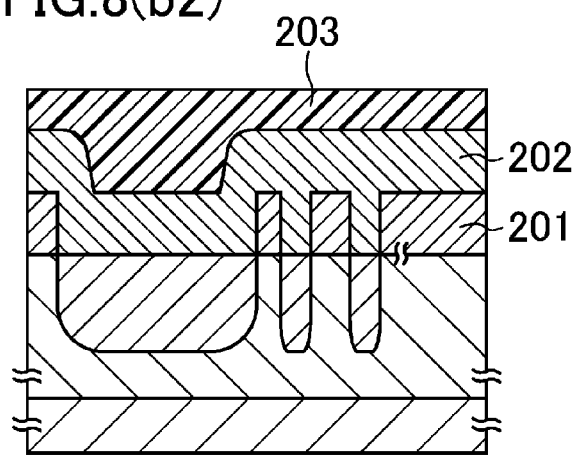
Figure 8:
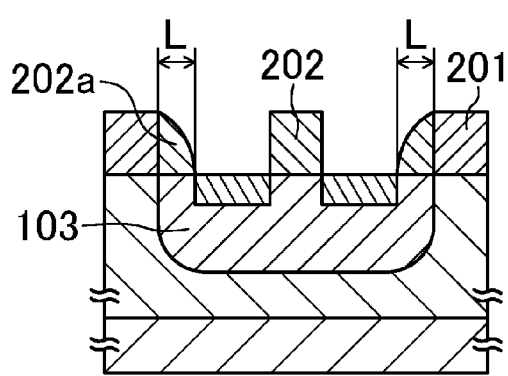
Figure 8:
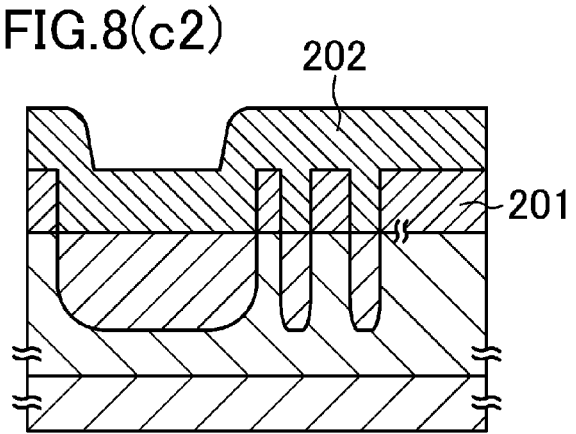

Next, as shown in FIG. 8(a1) and FIG. 8(a2), another mask film 202 is deposited on the entire surface of the mask film 201. After that, a resist mask 203 is formed by patterning a resist such that the ring regions 120, the second conductivity type impurity region 134, and a region where a contact region is to be formed are covered. The mask film 201 and the mask film 202 are preferably made of materials which allow the mask film 202 to be selectively dry etched with respect to the mask film 201. For example, the material of the mask film 201 may be $SiO_2$, and the material of the mask film 202 may be polysilicon.

Next, as shown in FIG. 8(b1) and FIG. 8(b2), the mask film 202 is dry etched using the resist mask 203. In the cell shown in FIG. 8(b1), part of the mask film 202 remains on a side surface of the mask film 201 due to a so-called self-aligned process, and a sidewall 202a is formed from the mask film 202. In the terminal shown in FIG. 8(b2), the mask film 202 is not etched because the mask film 202 is covered by the resist mask 203.

Next, as shown in FIG. 8(c1) and FIG. 8(c2), after the resist mask 203 is removed, the body region 103 is doped with impurities by, for example, implanting nitrogen (N) ions, thereby forming a source region 104 of a first conductivity type. In the case where the source region 104 is formed by ion implantation, ion implantation conditions, such as implantation energy and dosage amount of N ions, are decided such that a region with an impurity concentration of about $5 \times 10^{19}$ $cm^{-3}$ has a thickness of about 200 nm to 300 nm. In this structure, a length corresponding to the channel of the MISFET, that is, the length L shown in FIG. 8(c1) which defines the gate length later, can be controlled with accuracy. The length L is regulated by the width of the sidewall 202a, and is about 0.5 μm, for example.

Figure 9:
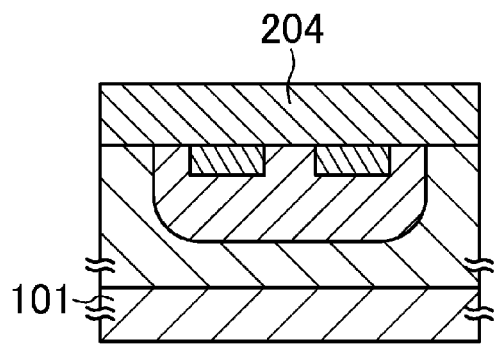
FIG. 9(a1) and FIG. 9(a2) to FIG. 9(c1) and FIG. 9(c2) are schematic cross-sections illustrating a method for fabricating the semiconductor device of the second embodiment in the order of steps.
Figure 9:
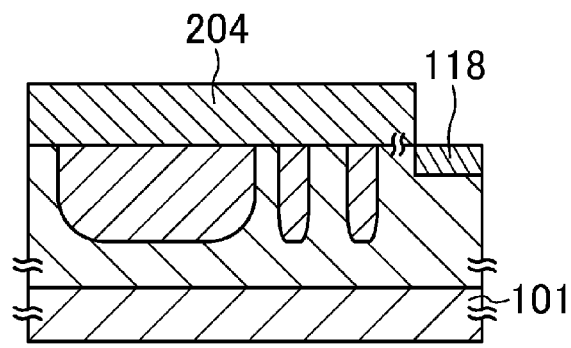
Figure 9:
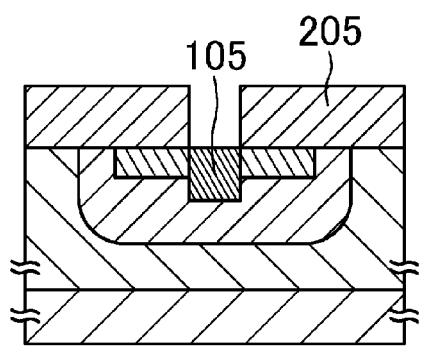
Figure 9:
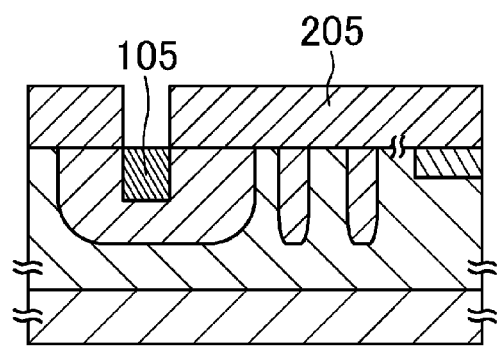
Figure 9:
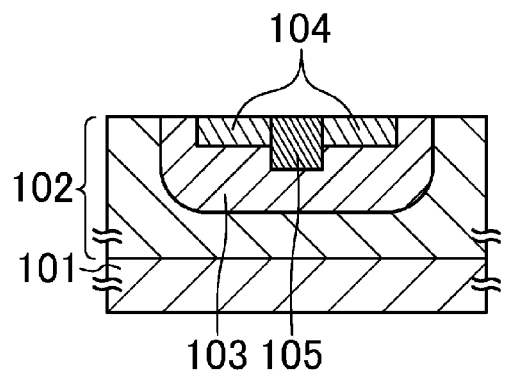
Figure 9:
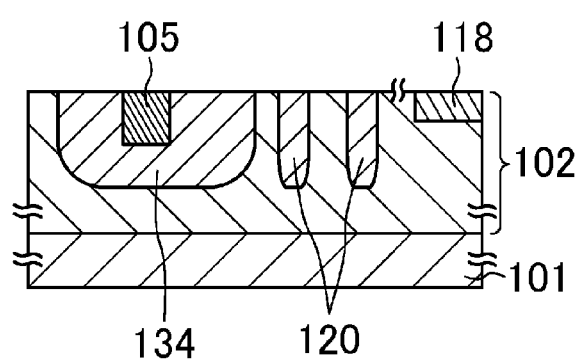

Next, as shown in FIG. 9(a1) and FIG. 9(a2), the mask films 201, 202 and the sidewall 202a are removed. Thereafter, another mask film 204 is formed on the semiconductor layer 102. The mask film 204 is provided with an opening at part of the terminal. Subsequently, N ions, for example, are implanted in the semiconductor layer 102 using the mask film 204, thereby forming a stopper region 118. The implantation conditions at this time may be equivalent to the implantation conditions in forming the source region 104, for example.

Next, as shown in FIG. 9(b1) and FIG. 9(b2), the mask film 204 is removed and another mask film 205 is formed on the semiconductor layer 102. The mask film 205 is provided with an opening in a region where a body contact region is to be formed. Al ions, for example, are implanted in the semiconductor layer 102 using the mask film 205, thereby forming a body contact region 105. The implantation conditions may be decided such that a dopant concentration is about $1 \times 10^{20}$ $cm^{-3}$ and a depth is about 400 nm, for example. The body contact region 105 may be formed in the body region 103. The mask film 205 is removed after the ion implantation.

After that, according to necessity, a mask having an opening is formed at a position between adjacent body regions 103, and N ions, for example, may be implanted in the semiconductor layer 102 to form a JFET region. The ion implantation conditions in forming the JFET region may be decided such that a dopant concentration is about $1 \times 10^{17}$ $cm^{-3}$ and an implantation depth is in a range of from about 0.6 μm to about 1 μm, for example.

The above ion implantation step may be conducted under the condition in which the semiconductor substrate 101 is heated to 200° C. or more.

Next, as shown in FIG. 9(c1) and FIG. 9(c2), the implanted impurity ions are activated by activation annealing under a high temperature of about from 1600° C. to 1900° C. It is possible to reduce surface roughness of the semiconductor substrate 101 caused by the activation annealing by forming, before the activation annealing, a carbon film (not shown) on a surface of the semiconductor substrate 101 having an implantation region. In the case where a carbon film is formed on the surface, the carbon film is removed after the activation annealing. The carbon film can be removed by being exposed to oxygen plasma, for example. Subsequently, according to necessity, the surface of the semiconductor substrate 101 may be cleaned by slightly oxidizing the surface and thereafter removing a thermal oxidation film obtained in a thickness of about 15 nm, for example.

Figure 10:
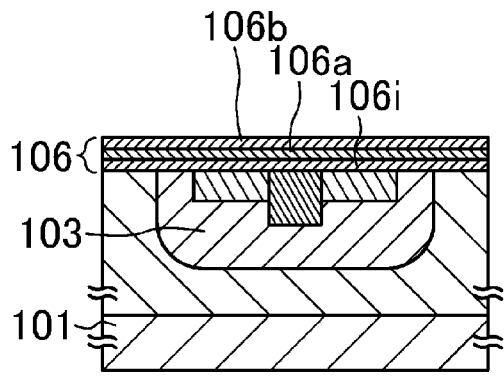
FIG. 10(a1) and FIG. 10(a2) to FIG. 10(c1) and FIG. 10(c2) are schematic cross-sections illustrating a method for fabricating the semiconductor device of the second embodiment in the order of steps.
Figure 10:
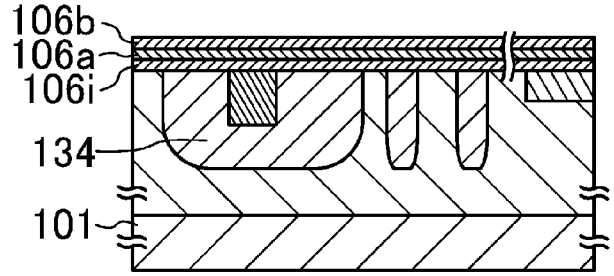
Figure 10:
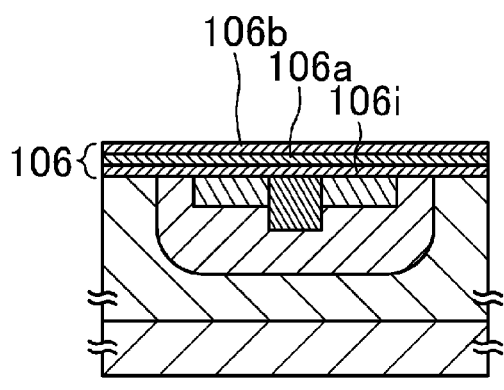
Figure 10:
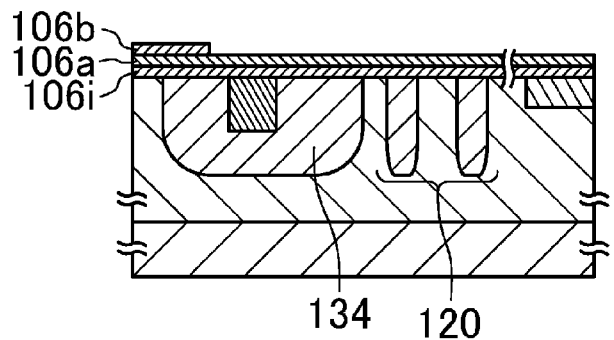
Figure 10:
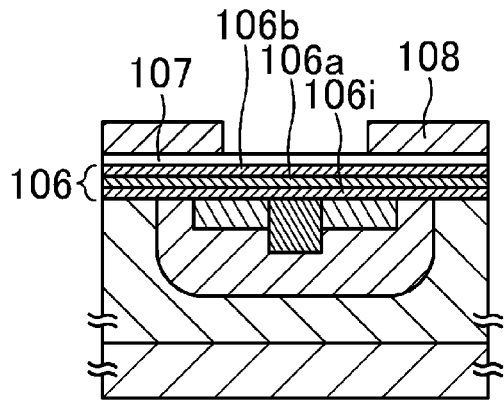
Figure 10:
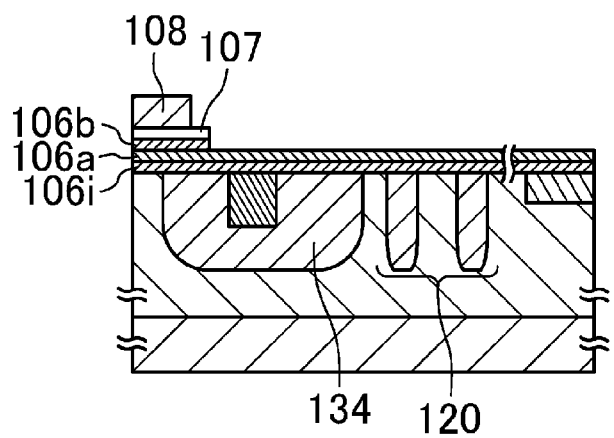

Next, as shown in FIG. 10(a1) and FIG. 10(a2), an epitaxial layer 106 is epitaxially grown on the entire surface of the semiconductor layer 102 which includes the body region 103, the source region 104, and the body contact region 105. In the present embodiment, as described above, the epitaxial layer 106 has a structure in which the interface epitaxial layer 106i, the first epitaxial layer 106a, and the second epitaxial layer 106b are sequentially formed on the body region 103. The first conductivity type impurity concentration of the interface epitaxial layer 106i is set to be higher than the first conductivity type impurity concentration of the first epitaxial layer 106a, and lower than the first conductivity type impurity concentration of the second epitaxial layer 106b. The interface epitaxial layer 106i has a thickness of 5 nm and an impurity concentration of $4 \times 10^{17}$ $cm^{-3}$, for example. The first conductivity type impurity concentration of the first epitaxial layer 106a is set to be lower than the first conductivity type impurity concentration of the second epitaxial layer 106b. For example, the first epitaxial layer 106a and the second epitaxial layer 106b each have a thickness of 20 nm, and have impurity concentrations of $1 \times 10^{16}$ $cm^{-3}$ and $1 \times 10^{18}$ $cm^{-3}$, respectively.

By setting the first conductivity type impurity concentration of the first epitaxial layer 106a to be lower than the first conductivity type impurity concentration of the second epitaxial layer 106b, it is possible to form an interface epitaxial layer 106i having an impurity concentration lower than the impurity concentration of the second epitaxial layer 106b, near the interface of the epitaxial layer 106 with the body region 103 during the epitaxial growth of the epitaxial layer 106.

The epitaxial growth method for forming the epitaxial layer 106 will be specifically described. To form the epitaxial layer 106, a silicon-based gas (e.g., a silane gas), a carbon-based gas (e.g., a propane gas) and a dopant gas (e.g., a nitrogen gas in the case of n-type gas) are supplied, while heating the substrate, using a CVD device, for example. The growth conditions are that the growth temperature is about from 1450° C. to 1650° C., and the growth pressure is from 50 hPa to 300 hPa, for example. The flow rate of each source gas is that 10 ml/min to 30 ml/min for $SiH_4$; 3 ml/min to 15 ml/min for $C_3H_8$; and 50 l/min to 200 l/min for $H_2$, under standard conditions (0° C., 1 atm). Step-flow growth is applied as the epitaxial growth mode. In the present embodiment, to prevent impurities from being excessively introduced in the interface epitaxial layer 106i at the beginning of the epitaxial growth, dopant gas is not supplied during growth of the first epitaxial layer 106a, but is supplied only during growth of the second epitaxial layer 106b, for example. Alternatively, the amount of dopant gas to be supplied during growth of the first epitaxial layer 106a is set to one tenth or less of the amount of dopant gas to be supplied during growth of the second epitaxial layer 106b, for example.

The time when no dopant gas is supplied, or the time when the supply amount of the dopant gas is reduced, may correspond to growth delay time at the beginning of growth of the epitaxial layer 106. The "growth delay time" as used herein is time from the start of the epitaxial growth to when the growth rate of the epitaxial layer stabilizes. In the growth delay time, several molecular layers or so are formed.

The supply amount of the dopant gas may be gradually increased from zero during growth of the first epitaxial layer 106a.

Due to the above epitaxial growth, it is possible to provide the epitaxial layer 106 having a structure in which the interface epitaxial layer 106i, the first epitaxial layer 106a, and the second epitaxial layer 106b are layered, and in which the first conductivity type impurity concentration of the interface epitaxial layer 106i is set to be higher than the first conductivity type impurity concentration of the first epitaxial layer 106a, and lower than the first conductivity type impurity concentration of the second epitaxial layer 106b.

In the present specification, the interface epitaxial layer 106i is such a layer which can be present within 20 nm from the interface between the body region 103 and the epitaxial layer 106, and has an impurity concentration higher than the impurity concentration of the first epitaxial layer 106a.

The thickness and the impurity concentration of each of the first epitaxial layer 106a and the second epitaxial layer 106b are appropriately adjusted according to a target value of a gate threshold voltage of the MISFET. The epitaxial layer 106 may have another epitaxial layer on the second epitaxial layer 106b. Further, the impurity concentration may not be abruptly changed at the interface between the first epitaxial layer 106a and the second epitaxial layer 106b. In the case where the impurity concentration is not abruptly changed, a portion having an impurity concentration of less than $1\times10^{17}$ cm$^{-3}$ may be considered as the first epitaxial layer 106a, and a portion having an impurity concentration of $1\times10^{17}$ cm$^{-3}$ or more may be considered as the second epitaxial layer 106b, for example.

Next, as shown in FIG. 10(b1) and FIG. 10(b2), the second epitaxial layer 106b of the epitaxial layer 106 located above the ring regions 120 and above part of the second conductivity type impurity region 134 is selectively dry etched, for example, thereby exposing the first epitaxial layer 106a under the second epitaxial layer 106b. Since the second epitaxial layer 106b having a high impurity concentration is selectively removed at the terminal as described above, it is possible to reduce a reduction in the breakdown voltage of the semiconductor device. Further, since the first epitaxial layer 106a having a low impurity concentration is located above the ring regions 120, the thickness reduction of the ring regions 120 due to overetching is prevented, and the reduction in breakdown voltage of the semiconductor device is accordingly reduced.

Next, as shown in FIG. 10(c1) and FIG. 10(c2), a gate insulating film 107 is formed on the epitaxial layer 106 by, for example, thermal oxidation. Subsequently, a gate electrode 108 is selectively formed on a desired region of the gate insulating film 107. The gate electrode 108 is formed by, for example, depositing a polycrystal silicon film doped with phosphorus (P) at a concentration of about $7\times10^{20}$ cm$^{-3}$, and thereafter dry etching the polycrystal silicon film using a mask (not shown). The thickness of the polycrystal silicon film is about 500 nm, for example. The gate electrode 108 is provided so as to cover at least a portion of the epitaxial layer 106 which functions as a channel.

Figure 11:
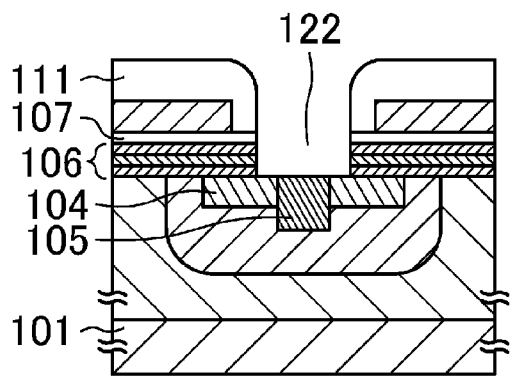
FIG. 11(a1) and FIG. 11(a2) to FIG. 11(c1) and FIG. 11(c2) are schematic cross-sections illustrating a method for fabricating the semiconductor device of the second embodiment in the order of steps.
Figure 11:
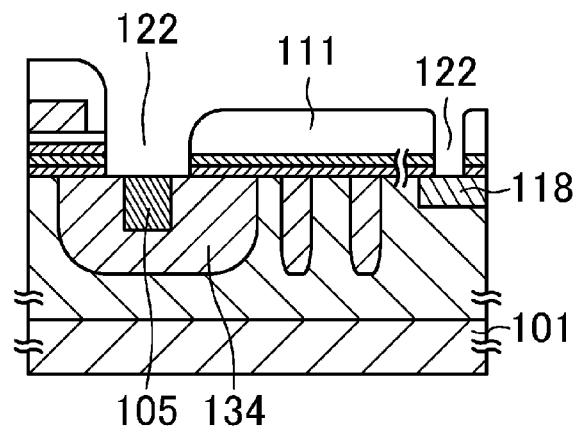
Figure 11:
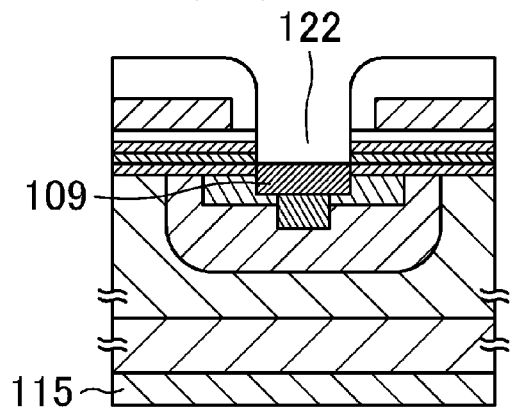
Figure 11:
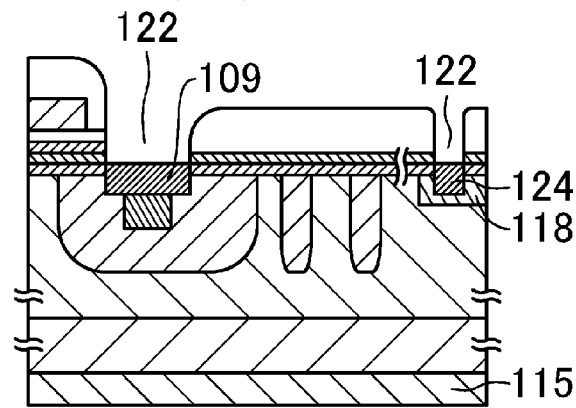
Figure 11:
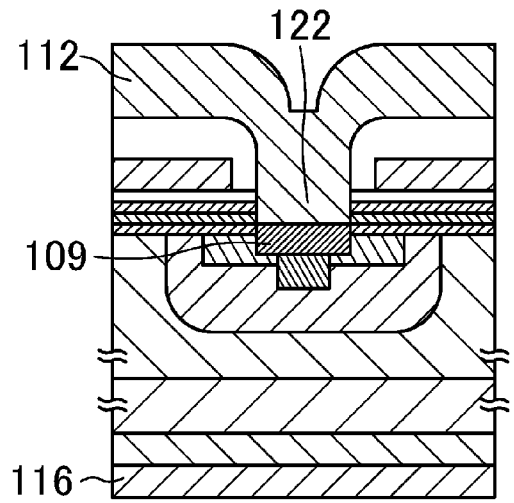
Figure 11:
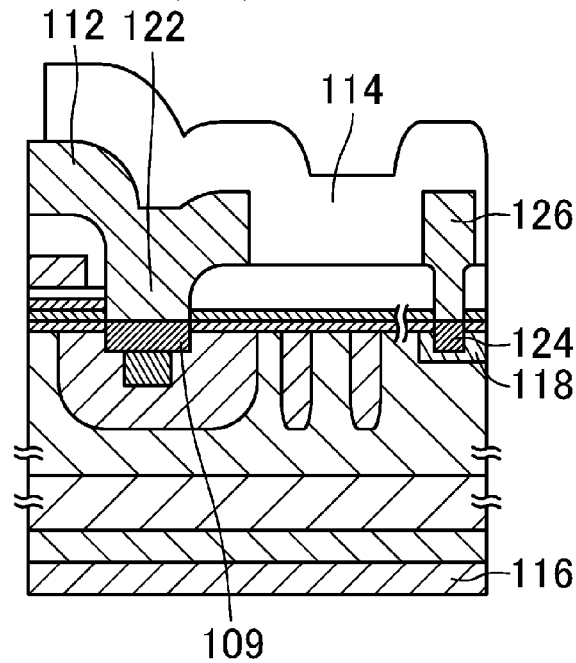

Next, as shown in FIG. 11(a1) and FIG. 11(a2), an interlayer insulating film 111 is deposited so as to cover the semiconductor layer 102, as well as the gate electrode 108, by CVD, for example. The interlayer insulating film 111 may be made of SiO$_2$, for example. The thickness of the interlayer insulating film 111 is 1.5 μm, for example. Subsequently, the interlayer insulating film 111, the gate insulating film 107, and the epitaxial layer 106 are sequentially dry etched using a mask (not shown), thereby forming, in the cell, a contact hole 122 exposing the body contact region 105 and part of the source region 104, and forming, in the terminal, a contact hole 122 exposing part of the second conductivity type impurity region 134 and part of the stopper region 118.

Next, a nickel film with a thickness of about 100 nm, for example, is formed on the entire surface of the interlayer insulating film 111 so as to be deposited on the bottom surface of the contact hole 122. Subsequently, the nickel film is subjected to a heat treatment for five minutes at a temperature of 950° C. under an inert atmosphere, for example, to have the nickel film react with the surface of the silicon carbide. After that, the nickel film on the interlayer insulating film 111 is removed to form a source electrode 109 and a contact electrode 124 which are made of nickel silicide on the bottoms of the respective contact holes 122 as shown in FIG. 11(b1) and FIG. 11(b2). A nickel film, for example, is deposited on the back side of the semiconductor substrate 101, as well, and the nickel film is subjected to a similar heat treatment to react with silicon carbide, and a drain electrode 115 is thereby formed.

Next, as shown in FIG. 11(c1) and FIG. 11(c2), an aluminum film having a thickness of about 4 μm is deposited on the interlayer insulating film 111 so as to connect with the source electrode 105 and the contact electrode 124 exposed from the contact holes 122. Subsequently, the deposited aluminum film is etched to have a desired pattern, thereby forming upper wirings 112, 126 made of aluminum. Further, a passivation film 114 is formed to cover the exposed portion of the interlayer insulating film 111 and part of the upper wirings 112, 126. The passivation film 114 is made of silicon nitride (SiN), for example, and has a thickness of about 1.5 μm, for example. Although not shown, a gate wiring in contact with a gate electrode 8 may be formed in another region at the chip end. Further, A back side wiring 116 for die bonding may be formed on the back side of the drain electrode 115. The back side wiring 116 may be a multilayer film in which Ti/Ni/Ag are sequentially formed from a side closer to the drain electrode 115, for example. The semiconductor device 100 in FIG. 6 can be obtained in this manner.

According to the semiconductor device 100 of the present embodiment, the following advantages can be obtained in addition to the advantages which can be obtained in the first embodiment. The second epitaxial layer 106b having a high impurity concentration is not provided on the semiconductor layer 102 in the terminal 160. With this structure, extension of a depletion layer at the terminal 160 is not restricted, and therefore, the low field intensity can be kept at the terminal 160. Thus, a reduction in the breakdown voltage of the semiconductor device 100 can be reduced.

Further, according to the method for fabricating the semiconductor device 100 of the present embodiment, the second epitaxial layer 106b having a high impurity concentration is removed at the terminal. Thus, a reduction in the breakdown voltage of the semiconductor device 100 can be reduced. Further, the first epitaxial layer 106a is provided on the ring regions 120. With this structure, the thickness reduction of the ring regions 120 due to overetching is prevented, and the reduction in breakdown voltage of the semiconductor device 100 is accordingly reduced.

(Example of Second Embodiment)

An example of the second embodiment will be described below with reference to the drawings.

A semiconductor device of the second embodiment was prepared to evaluate variations of a gate threshold voltage in the wafer plane and a breakdown voltage.

As an example, a plurality of 5 mm square semiconductor devices 100 were formed on an n-type 4H—SiC off-cut substrate having a diameter of about 7.6 cm, on the entire principal surface of the wafer. The epitaxial layer 106 includes an interface epitaxial layer 106$i$, a first epitaxial layer 106$a$, a second epitaxial layer 106$b$ and a third epitaxial layer 106$c$, as in the example of the first embodiment. In the case where a gate insulating film is formed on the third epitaxial layer 106$c$ by thermal oxidation, the third epitaxial layer 106$c$ is deposited to have an extra thickness (e.g., about 50 nm) beforehand because part of the third epitaxial layer 106$c$ is changed into the gate insulating film by the thermal oxidation. For example, in the case where the thickness of the third epitaxial layer 106$c$ which is required in the semiconductor device 100 is 10 nm, an extra thickness of about 50 nm is deposited, and thus, the third epitaxial layer 106$c$ needs to have a thickness of about 60 nm right after the epitaxial growth. After that, an oxidation step is performed to form the semiconductor device 100. The thicknesses of the interface epitaxial layer 106$i$, the first epitaxial layer 106$a$, the second epitaxial layer 106$b$, and the third epitaxial layer 106$c$ which are included in the epitaxial layer 106 are 5 nm, 20 nm, 20 nm, and 10 nm, respectively. The impurity concentrations of the interface epitaxial layer 106$i$, the first epitaxial layer 106$a$, the second epitaxial layer 106$b$, and the third epitaxial layer 106$c$ are $4 \times 10^{17}$ cm$^{-3}$, $1 \times 10^{16}$ cm$^{-3}$, $1 \times 10^{18}$ cm$^{-3}$, and $1 \times 10^{16}$ cm$^{-3}$, respectively.

Twenty ring regions 120 are provided in the terminal, with a space of about 1 μm to 4 μm interposed between one another. Each ring region has a width of about 1 μm, and a depth that is equal to the depth of the body region 103, for example. The second epitaxial layer 106$b$ is formed such that parts above the ring regions 120 are removed by dry etching, for example, and exposes the first epitaxial layer 106$a$.

As a comparison example, a semiconductor device having a structure similar to the structure of the present example, except that the first epitaxial layer 106$a$ is not provided and that the epitaxial layer 106 in the terminal 160 is not etched but remained, was prepared.

In the semiconductor device of the comparison example, variations 6 of a gate threshold voltage (Vth) in the wafer plane are in a range from 1.0 V to 1.3 V. On the other hand, in the semiconductor device of the present example, variations 6 of a gate threshold voltage in the wafer plane are in a range from 0.3 V to 0.4 V. The variations 6 of the gate threshold voltage in the wafer plan are standard deviations of the gate threshold voltage in the wafer plane.

Figure 12:
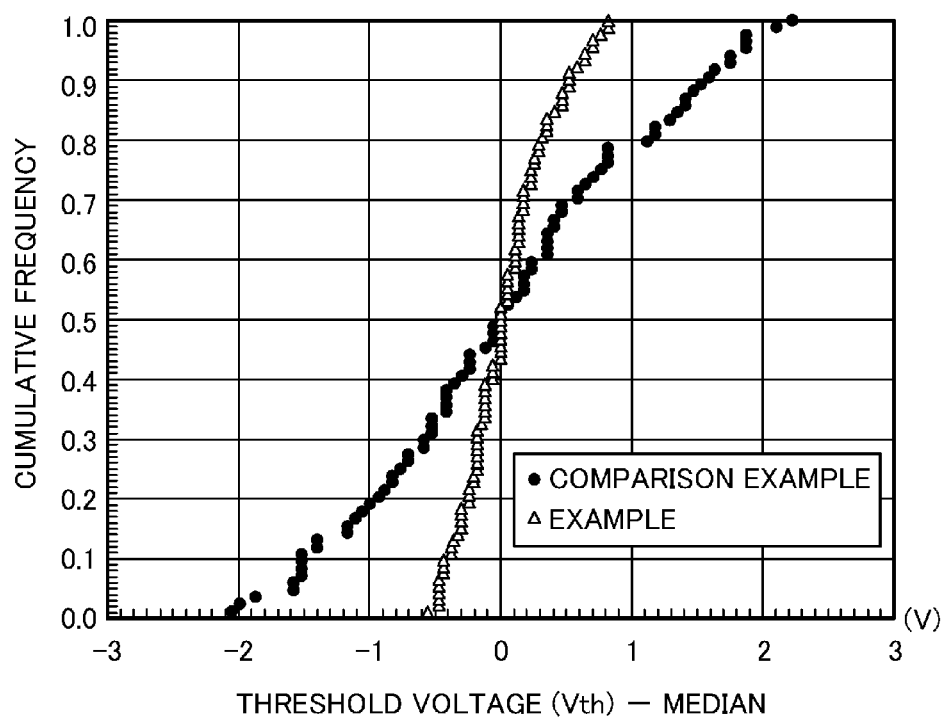
FIG. 12 is a graph showing cumulative frequency distributions of gate threshold voltages of a semiconductor device of an example of the second embodiment and a semiconductor device according to a comparison example.

FIG. 12 shows cumulative frequency distributions of gate threshold voltages of a semiconductor device of the present example and a semiconductor device of the comparison example. The horizontal axis indicates a difference between a gate threshold voltage (Vth) and a median of the respective semiconductor devices. The vertical axis indicates a cumulative frequency. In FIG. 12, the black dots (•) show the measurement results according to the comparison example, and the white triangles (Δ) show the measurement results according to the present example. It is found from FIG. 12 that in the semiconductor device of the present example, variations of the gate threshold voltage in the wafer plane are reduced, compared to the semiconductor device of the comparison example.

As described above, in the semiconductor device of the present disclosure, shifts in the gate threshold voltage of the semiconductor device can be reduced, and variations in the gate threshold voltage in the wafer plane can be reduced, while ensuring a reduction in leakage current and reliability.

Next, breakdown voltages between source and drain in the semiconductor device of the present example and the semiconductor device of the comparison example were measured. The breakdown voltage between source and drain in the semiconductor device of the comparison example was 511 V. The breakdown voltage between source and drain in the semiconductor device of the present example was 931 V. It is found from these results that the breakdown voltage is improved in the semiconductor device of the present example, compared to the semiconductor device of the comparison example.

(Third Embodiment)

A semiconductor device of the third embodiment will be described below with reference to the drawings.

FIG. 13($a$) shows a schematic plan view of a semiconductor device 200 of the present embodiment. FIG. 13($b$) shows a schematic cross-section of a unit cell 252 which forms a cell 250 of the semiconductor device 200. FIG. 13($c$) shows a schematic cross-section of a region near a terminal 260 of the semiconductor device 200.

In the semiconductor device 100 of first embodiment described above, the unit cell 152 is a planar gate type MISFET, whereas in the semiconductor device 200 of the present embodiment, the unit cell 252 is a trench gate type MISFET. Like reference characters have been used to designate identical elements as the elements of the semiconductor device 100.

The semiconductor device 200 is mainly made of silicon carbide (SiC) semiconductor. The semiconductor device 200 includes a cell 250 having a function of an element, and a terminal 260 which complements a breakdown voltage of the cell 250. The cell 250 includes a plurality of unit cells 252. As shown in FIG. 13($a$), the terminal 260 surrounds the cell 250 when viewed along the direction of a normal to the principal surface of the semiconductor substrate 101.

The semiconductor device 200 of the present embodiment may have a diode portion 230 between the cell 250 and the terminal 260. In the diode portion 230, a pn-junction diode is formed due to a second conductivity type impurity region 234 and the semiconductor layer 102.

As shown in FIG. 13($b$), a trench 270 which passes through the source region 104 and the body region 103 and reaches the drift region 132 is formed in the semiconductor layer 102 which forms the semiconductor device 200. The epitaxial layer 106 is provided so as to cover a side wall portion, a bottom portion, and an upper surface of the trench 270. A channel region is formed at a portion of the epitaxial layer 106 which is in contact with the body region 103 at the side wall portion of the trench 270. The gate length L is defined by the length between the bottom surface of the body region 103 and the bottom surface of the source region 104, e.g., about 0.5 μm. The epitaxial layer 106 includes an interface epitaxial layer (a pile-up layer) 106$i$ in contact with the body region 103, a first epitaxial layer 106$a$ in contact with the interface epitaxial layer 106$i$, and a second epitaxial layer 106$b$ in contact with the first epitaxial layer 106$a$.

The first conductivity type (e.g., n-type) impurity concentration of the interface epitaxial layer 106$i$ is higher than the first conductivity type impurity concentration of the first epitaxial layer 106$a$, and lower than the first conductivity type impurity concentration of the second epitaxial layer 106b. The interface epitaxial layer 106i has a thickness of 5 nm, and an impurity concentration of $4\times10^{17}$ cm$^{-3}$, for example. Further, for example, the first epitaxial layer 106a and the second epitaxial layer 106b each have a thickness of 20 nm, and impurity concentrations of $1\times10^{16}$ cm$^{-3}$ and $1\times10^{18}$ cm$^{-3}$, respectively.

The first conductivity type impurity concentration of the first epitaxial layer 106a is lower than the first conductivity type impurity concentration of the second epitaxial layer 106b. By setting the first conductivity type impurity concentration of the first epitaxial layer 106a to be lower than the first conductivity type impurity concentration of the second epitaxial layer 106b, it is possible to reduce an increase in the impurity concentration of the interface epitaxial layer 106i near the interface with the body region 103 during epitaxial growth of the epitaxial layer 106. The epitaxial layer 106 has a three-layer structure including an interface epitaxial layer 106i, the first epitaxial layer 106a, and the second epitaxial layer 106b, but is not limited to this structure. The epitaxial layer 106 may have another epitaxial layer on the second epitaxial layer 106b.

Further, the second epitaxial layer 106b having an impurity concentration higher than the impurity concentration of the first epitaxial layer 106a is not provided in an upper portion of the semiconductor layer 102 above the terminal 260. It is thus possible to reduce a reduction in the breakdown voltage of the semiconductor device 200 of the present embodiment.

In the above embodiments, an example in which the structure at the terminal is a field limiting ring (FLR) structure has been described, but the terminal structure is not limited to this structure. For example, the terminal may have a junction termination edge (JTE) structure.

(First Variation of the Present Disclosure)

A semiconductor device according to the first variation of the present disclosure will be described below with reference to the drawings.

FIG. 14(a) shows a schematic plan view of a semiconductor device 300 according to the first variation of the present disclosure. FIG. 14(b) shows a schematic cross-section of a unit cell 152 which forms a cell 150 of the semiconductor device 300. FIG. 14(c) shows a schematic cross-section of a region near a terminal 360 of the semiconductor device 300.

The structure of the unit cell 152 of the semiconductor device 300 according to the present variation shown in FIG. 14(b) is the same as the structure of the unit cell 152 of the semiconductor device 100 according to the first embodiment.

The semiconductor device 300 of the present variation is different from the semiconductor device 100 of the second embodiment shown in FIG. 6 in that not the FLR structure but the JTE structure is used as the structure of the terminal 360.

As shown in FIG. 14(c), the terminal 360 which forms the semiconductor device 300 includes a JTE region 321 around the second conductivity type impurity region 134 in the drift region 132. The JTE region 321 is of a second conductivity type (e.g., p-type) and has an impurity concentration lower than the impurity concentration of the second conductivity type impurity region 134. In the present variation, an example in which one JTE region 321 is provided has been described, but the structure is not limited to this structure. For example, a plurality of JTE regions may be provided at the terminal 360, and arranged such that the impurity concentrations of the JTE regions are gradually decreased with a decreasing distance from the cell 150 to the outside.

The structure of the terminal 360 may be a GRA-RESURF structure, for example. The GRA-RESURF structure corresponds to a structure in which the JTE structure and the FLR structure are combined.

The structure of the terminal 360 may be combined with the unit cell 252 of the third embodiment shown in FIG. 13(b).

(Second Variation of the Present Disclosure)

A semiconductor device according to the second variation of the present disclosure will be described with reference to the drawings.

FIG. 15(a) shows a schematic plan view of a semiconductor device 400 according to the second variation of the present disclosure. FIG. 15(b) shows a schematic cross-section of a unit cell 152 which forms a cell 150 of the semiconductor device 400. FIG. 15(c) shows schematic cross-section of a region near a terminal 460 of the semiconductor device 400.

The structure of the unit cell 152 of the semiconductor device 400 according to the present variation shown in FIG. 15(b) is the same as the structure of the unit cell 152 of the semiconductor device 100 according to the first embodiment.

The semiconductor device 400 of the present variation is different from the semiconductor device 100 of the second embodiment shown in FIG. 6 in that not the FLR structure but the GRA-RESURF structure is used as the structure of the terminal 460.

As shown in FIG. 15(c), the terminal 460 which forms the semiconductor device 400 includes a JTE region 421 around the second conductivity type impurity region 134 in the drift region 132. The JTE region 421 is of a second conductivity type (e.g., p-type) and has an impurity concentration lower than the impurity concentration of the second conductivity type impurity region 134. In the present variation, an example in which one JTE region 421 is provided has been described, but the structure is not limited to this structure. For example, a plurality of JTE regions may be provided at the terminal 460, and arranged such that the impurity concentrations of the JTE regions are gradually decreased with a decreasing distance from the cell 150 to the outside.

In the present variation, as shown in FIG. 15(c), the terminal 460 of the semiconductor device 400 is provided with two low-concentration ring regions 422 formed in the drift region 132 around outside the JTE region 421 and spaced apart from each other. Each of the low concentration ring regions 422 is of a second conductivity type (e.g., p-type) and has an impurity concentration lower than the impurity concentration of the second conductivity type impurity region 134. In the present variation, the number of the low concentration ring regions 422 is two, but the number of the low concentration ring regions 422 is not limited to two. For example, the terminal 460 may be provided with three or more low concentration ring regions 422.

The structure of the terminal 460 may be combined with the unit cell 252 of the third embodiment shown in FIG. 13(b).

In the embodiments and variations described above, the first conductivity type was described as an n-type, and the second conductivity type was described as a p-type, but on the contrary, the first conductivity type may be p-type and the second conductivity type may be n-type.

In the embodiments and variations described above, a MISFET was described as a semiconductor device, but the semiconductor device is not limited to MISFET. The semiconductor device may be another semiconductor device which has a gate electrode and a first ohmic electrode on the principal surface of the semiconductor substrate, and has a second ohmic electrode on the back side of the semiconductor substrate. For example, an insulated gate bipolar transistor (IGBT) may be used. The IGBT can be formed by making the semiconductor substrate of the semiconductor device of each embodiment above and the semiconductor layer to be formed on the semiconductor substrate have different conductivity types.

In the IGBT, the source electrode, the drain electrode, and the source region described in the above embodiments are called an emitter electrode, a collector electrode, and an emitter region, respectively. An n-type IGBT can be obtained when the conductivity type of the drift region and the emitter region is n-type, and the conductivity type of the semiconductor substrate and the body region is p-type in the above embodiments. In this case, an n-type buffer layer may be provided between the p-type semiconductor substrate and the n-type drift region. On the other hand, a p-type IGBT can be obtained when the conductivity type of the drift region and the emitter region is p-type, and the conductivity type of the semiconductor substrate and the body region is n-type. In this case, a p-type buffer layer may be provided between the n-type semiconductor substrate and the p-type drift region.

In the above embodiments, the semiconductor substrate is made of 4H—SiC, and the principal surface thereof is tilted from a (0001)Si plane by 8°, but the semiconductor substrate is not limited to this configuration. For example, the semiconductor substrate may also be a polytype SiC substrate other than 4H—SiC. Further, the principal surface of the semiconductor substrate may be a plane other than the (0001)Si plane or may be offcut planes of these planes. The angle of the offcut plane may be other than 8°.

The present disclosure is applicable not only to the SiC substrate, but also to a semiconductor device using another wide band gap semiconductor, such as gallium nitride (GaN) or diamond (C). The present disclosure is also applicable to a semiconductor device using silicon.

The other configurations of the semiconductor device according to the embodiments and variations described above, such as the shape and size of the elements, impurity concentrations, and constituent materials, can be modified without deviating from the scope of the present disclosure.

INDUSTRIAL APPLICABILITY

The present disclosure is useful for a semiconductor device such as a MISFET, and particularly useful for a power semiconductor device used in an electric power converter for use in vehicles and industrial equipment.

DESCRIPTION OF REFERENCE CHARACTERS 100, 200, 300, 400 semiconductor device
101 semiconductor substrate
102 semiconductor layer
103 body region
104 source region
105 body contact region
106 epitaxial layer
106i interface epitaxial layer
106a first epitaxial layer
106b second epitaxial layer
106c third epitaxial layer
107 gate insulating film
108 gate electrode
109 source electrode
111 interlayer insulating film
112, 126 upper wiring
114 passivation film
115 drain electrode
116 back side wiring
118 stopper region
120 ring region
122 contact hole
124 contact electrode
130, 230 diode portion
132 drift region
134, 234 second conductivity type impurity region
150, 250 cell
152, 252 unit cell
160, 260, 360, 460 terminal
201, 202, 204, 205 mask film
202a sidewall
203 resist mask
270 trench
321, 421 JTE region
422 low concentration ring region
506b high concentration layer
506c low concentration layer

The invention claimed is:
1. A semiconductor device, comprising:
a semiconductor substrate;
a semiconductor layer provided on a principal surface of the semiconductor substrate and including a drift region of a first conductivity type, a body region of a second conductivity type provided at a position next to the drift region, and an impurity region of a first conductivity type provided at a position next to the body region;
an epitaxial layer in contact with the body region;
a gate insulating film provided at a position facing the body region with the epitaxial layer interposed therebetween; and
a gate electrode provided at a position facing the epitaxial layer with the gate insulating film interposed therebetween, wherein
the epitaxial layer includes
an interface epitaxial layer in contact with the body region,
a first epitaxial layer in contact with the interface epitaxial layer, and
a second epitaxial layer in contact with the first epitaxial layer, and
a first conductivity type impurity concentration of the interface epitaxial layer is higher than a first conductivity type impurity concentration of the first epitaxial layer, and lower than a first conductivity type impurity concentration of the second epitaxial layer.
2. The semiconductor device of claim 1, wherein
the first conductivity type impurity concentration of the first epitaxial layer is less than $1 \times 10^{17}$ cm$^{-3}$.
3. The semiconductor device of claim 1, wherein
an impurity concentration of the interface epitaxial layer is higher than a first conductivity type impurity concentration of the body region.
4. The semiconductor device of claim 1, further comprising:
a trench provided in the semiconductor layer, wherein
the epitaxial layer is provided at a position which covers at least part of a side surface of the trench.
5. The semiconductor device of claim 1, wherein
the semiconductor layer and the epitaxial layer are made of silicon carbide.
6. The semiconductor device of claim 1, further comprising:
a cell provided on the semiconductor substrate; and
a terminal provided at a position on the semiconductor substrate and surrounding the cell, wherein the cell includes the semiconductor layer, the epitaxial layer, the gate insulating film, the gate electrode, a first ohmic electrode, and a second ohmic electrode, the first ohmic electrode is electrically connected to the impurity region, and the second ohmic electrode is provided on a back side of the semiconductor substrate, and the interface epitaxial layer in contact with the semiconductor layer, and the first epitaxial layer in contact with the interface epitaxial layer are provided at the terminal, and the second epitaxial layer is not provided at the terminal.

7. The semiconductor device of claim 1, wherein:
the epitaxial layer is in contact with at least part of the body region and at least part of the impurity region, and
the impurity region of the first conductivity type is a region which functions as a source region or an emitter region.

8. The semiconductor device of claim 3, wherein
the first conductivity type impurity concentration of the first epitaxial layer is lower than a first conductivity type impurity concentration of the drift region.

9. The semiconductor device of claim 6, wherein
the terminal includes a ring region of a second conductivity type provided in the semiconductor layer, and
the first epitaxial layer is in contact with the ring region.

10. A method for fabricating a semiconductor device, comprising the steps of:
forming, on a principal surface of a semiconductor substrate, a semiconductor layer including a drift region of a first conductivity type, a body region of a second conductivity type at a position next to the drift region, and an impurity region of a first conductivity type at a position next to the body region,
forming an epitaxial layer in contact with the body region,
forming a gate insulating film at a position facing the body region with the epitaxial layer interposed therebetween, and
forming a gate electrode at a position facing the epitaxial layer with the gate insulating film interposed therebetween, wherein the step of forming the epitaxial layer includes the steps of
forming an interface epitaxial layer in contact with the body region,
forming a first epitaxial layer in contact with the interface epitaxial layer, and
forming a second epitaxial layer in contact with the first epitaxial layer, and
a first conductivity type impurity concentration of the interface epitaxial layer is higher than a first conductivity type impurity concentration of the first epitaxial layer, and lower than a first conductivity type impurity concentration of the second epitaxial layer.

11. The method of claim 10, wherein
the epitaxial layer is formed by chemical vapor deposition.

12. The method of claim 10, wherein
the semiconductor substrate further includes a cell provided on the semiconductor substrate, and a terminal provided at a position on the semiconductor substrate and surrounding the cell, and
the method further includes, after the step of forming the epitaxial layer, a step of etching part of the epitaxial layer to expose the first epitaxial layer at the terminal.

13. The method of claim 10, wherein:
in the step of forming an epitaxial layer, the epitaxial layer is formed to be in contact with at least part of the body region and at least part of the impurity region, and
the impurity region of the first conductivity type is a region which functions as a source region or an emitter region.

14. The method of claim 11, wherein
the step of forming the interface epitaxial layer and the step of forming the first epitaxial layer are successively performed without changing an amount of dopant gas to be supplied.

15. The method of claim 11, wherein
in the step of forming the epitaxial layer,
an amount of dopant gas to be supplied during growth of the first epitaxial layer is one tenth or less of an amount of dopant gas to be supplied during growth of the second epitaxial layer, or
no dopant gas is supplied during the growth of the first epitaxial layer.

* * * * *